United States Patent
Shinohara et al.

(10) Patent No.: US 7,986,085 B2
(45) Date of Patent: Jul. 26, 2011

(54) LIGHT EMITTING APPARATUS AND ELECTRONIC EQUIPMENT PROVIDED WITH THE LIGHT EMITTING APPARATUS

(75) Inventors: Yuji Shinohara, Suwa (JP); Tetsuo Nakagawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 160 days.

(21) Appl. No.: 11/922,002

(22) PCT Filed: May 24, 2006

(86) PCT No.: PCT/JP2006/310347
§ 371 (c)(1),
(2), (4) Date: Feb. 28, 2008

(87) PCT Pub. No.: WO2006/134758
PCT Pub. Date: Dec. 21, 2006

(65) Prior Publication Data
US 2009/0284128 A1    Nov. 19, 2009

(30) Foreign Application Priority Data
Jun. 14, 2005  (JP) .................. 2005-173263

(51) Int. Cl.
H05B 33/00      (2006.01)
H05B 33/12      (2006.01)
H01J 9/00       (2006.01)

(52) U.S. Cl. ........ 313/498; 313/503; 313/504; 313/512; 445/24; 445/25; 428/690

(58) Field of Classification Search ........... 313/498–512
See application file for complete search history.

(56) References Cited

U.S. PATENT DOCUMENTS
2004/0017152 A1    1/2004   Hashimoto et al.
(Continued)

FOREIGN PATENT DOCUMENTS
JP            A 10-39791              2/1998
(Continued)

OTHER PUBLICATIONS
Fujimori et al, Japanese Patent Publication 2000-235891, Aug. 2000, machine translation.pdf.*

(Continued)

*Primary Examiner* — Anne Hines
*Assistant Examiner* — Tracie Green

(57) ABSTRACT

A light emitting apparatus including a plurality of light emitting devices for different colors and having a simple structure with small variations in luminous brightness of each of the light emitting devices for the different colors is provided, and electronic equipment provided with such a light emitting apparatus is also provided. The light emitting apparatus is configured into a display apparatus 10 which comprises: a TFT circuit board (counter substrate) 20; red light emitting devices 1R provided on the TFT circuit board 20 and emitting a light of a red luminescent color (R); green light emitting devices 1G provided on the TFT circuit board 20 and emitting a light of a green luminescent color (G); and blue light emitting devices 1B provided on the TFT circuit board 20 and emitting a light of a blue luminescent color (B); and wherein roughness is formed on an interface between a hole transport layer 4 and a red light emitting layer 5R in each of the red light emitting devices 1R, while no roughness is formed on an interfaces between a hole transport layer and a light emitting layer in each of the green light emitting devices 1G and the blue light emitting devices 1B. With these structures, it is possible to make the luminous brightness in each of the light emitting devices 1R, 1G and 1B for the respective colors substantially equal to each other when substantially the same voltage is applied thereto.

14 Claims, 7 Drawing Sheets

U.S. PATENT DOCUMENTS

| | | |
|---|---|---|
| 2004/0017153 A1 | 1/2004 | Nishikawa |
| 2004/0066127 A1* | 4/2004 | Sung ............................ 313/311 |
| 2004/0227140 A1* | 11/2004 | Lee et al. ........................ 257/79 |
| 2004/0227446 A1 | 11/2004 | Fujimoto et al. |

FOREIGN PATENT DOCUMENTS

| | | |
|---|---|---|
| JP | A 11-54270 | 2/1999 |
| JP | A 2000-235891 | 8/2000 |
| JP | A 2002-110352 | 4/2002 |
| JP | A 2002-313567 | 10/2002 |
| JP | A 2003-123967 | 4/2003 |
| JP | A 2003-243152 | 8/2003 |
| JP | A 2003-257662 | 9/2003 |
| JP | A 2004-111354 | 4/2004 |
| JP | A 2004-258380 | 9/2004 |
| JP | A 2005-142055 | 6/2005 |

OTHER PUBLICATIONS

Nishimura et al., Japanese Patent Publication 2002-313567, Oct. 2002, machine translation.*

* cited by examiner

LIGHT EMITTING APPARATUS AND ELECTRONIC EQUIPMENT PROVIDED WITH THE LIGHT EMITTING APPARATUS

CROSS-REFERENCE TO RELATED APPLICATION

This application claims a priority to Japanese Patent Application No. 2005-173263 filed on Jun. 14, 2005 which is hereby expressly incorporated by reference herein in its entirety.

BACKGROUND

1. Technical Field

The present invention relates to a light emitting apparatus and electronic equipment provided with the light emitting apparatus.

2. Related Art

An organic EL device (light emitting device) has a structure in which organic layers which include a thin layer (light emitting layer) containing at least fluorescent organic compounds is arranged between a cathode and an anode. Further, the organic EL device is a device (element) which emits light by using emitted light (fluorescence or phosphorescence) which is emitted when exciter (exciton) generated by injecting electrons and holes to the thin layer and recombining them therein is deactivated.

The organic EL device has characteristics that it is possible to provide surface emission having high brightness in a range of about 100 to 100,000 $cd/m^2$ at a low voltage of 10 or less V, and emit light from blue color to red color by selecting kinds of light emitting materials to be used. Therefore, the organic EL device is noticed as a device which can realize a full-color display having a large screen size at a low price (see e.g. JP-A-11-54270).

However, properties of light emitting materials which constitute light emitting layers of organic EL devices differ according to each of colors. Therefore, this poses a problem in that when the light emitting layers of the organic EL devices for the respective colors are configured to have the same structure, the luminous brightness of each of the organic EL devices for the respective colors varies among the organic EL devices.

In order to solve this problem, it may be conceived that an organic EL device having such low luminous brightness for a specified color is configured so that a voltage applied thereto is set to be higher than a voltage applied to the others organic EL devices for other colors. However, this approach needs a complicated control circuit for realizing such configuration, which results in an increased cost.

SUMMARY

Accordingly, it is an object of the present invention to provide a light emitting apparatus having a simple structure with small variations in luminous brightness of each of colors and electronic equipment which is provided with the light emitting apparatus.

The object is achieved by the present invention described below. In a first aspect of the present invention, there is provided a light emitting apparatus. The light emitting apparatus is provided with a plurality of light emitting devices for emitting a plurality of predetermined different colors. Each of the plurality of the light emitting devices comprises a light emitting layer, and a carrier transport layer which is provided in contact with the light emitting layer through an interface therebetween, wherein the plurality of light emitting devices include light emitting devices for at least one predetermined color, wherein the interface of each of the light emitting devices for the at least one predetermined color is formed into a roughened surface, and wherein the roughness of the interfaces of the light emitting devices for the at least one predetermined color is set so that the luminous brightness of the light emitting devices for the respective colors becomes substantially equal to each other when a substantially same voltage is applied thereto.

This makes it possible to provide a light emitting apparatus having a simple structure with small variations in luminous brightness of each of colors.

In a second aspect of the present invention, there is provided a light emitting apparatus. The light emitting apparatus is provided with a plurality of light emitting devices for emitting a plurality of predetermined different colors. Each of the plurality of the light emitting devices comprises a light emitting layer, and a carrier transport layer which is provided in contact with the light emitting layer through an interface therebetween, wherein the interface of each of the light emitting devices is formed into a roughened surface, and wherein the roughness of the interfaces of the light emitting devices for each color is adjusted so that the luminous brightness of these light emitting devices for the respective colors becomes substantially equal to each other when a substantially same voltage is applied thereto.

This also makes it possible to provide a light emitting apparatus having a simple structure with small variations in luminous brightness of each of colors.

In the light emitting apparatus according to the present invention, it is preferred that the luminous brightness of each of the light emitting devices is increased by forming the interface thereof into the roughened surface.

This makes it possible to adjust the luminous brightness of each of the plurality of light emitting devices for the respective colors when the substantially same voltage is applied thereto.

In the light emitting apparatus according to the present invention, it is preferred that the at least one predetermined color is red color, and the roughness of the interface of each of the light emitting devices for the red color is larger than the roughness of the interface of each of the light emitting devices for the others colors.

According to the light emitting apparatus having the structure mentioned above, in the case where light emitting materials having such characteristics that luminous brightness of red color is lowest, luminous brightness of each of green and blue colors is higher than the luminous brightness of the red color, and the luminous brightness of the green color and the luminous brightness of the blue color are substantially the same with each other are used as the light emitting materials for the light emitting devices for the respective colors, the luminous brightness of the red color is increased due to the large roughness of the interface so that the luminous brightness of each color can be made substantially equal to each other when a substantially same voltage is applied to the light emitting devices for the respective colors.

In the light emitting apparatus according to the present invention, it is preferred that the roughness of the interface of each of the light emitting devices for the at least one predetermined color is formed so as to have height unevenness.

This makes it possible to prevent lights emitted from the light emitting devices from interfering, and therefore it is also possible to prevent optical properties from being lowered (deteriorated) appropriately.

In the light emitting apparatus according to the present invention, it is preferred that in each of the light emitting devices for the at least one predetermined color, the light emitting layer has a first surface which is in contact with the carrier transport layer and a second surface opposite to the first surface, the carrier transport layer has a first surface which is in contact with the first surface of the light emitting layer and a second surface opposite to the first surface, and both the first surfaces are formed with numbers of minute convex portions which form the roughness, wherein the density of the convex portions on the first surface of the light emitting layer or the first surface of the carrier transport layer is in the range of 70 to $1\times10^6$ pieces with respect to 1 mm$^2$.

This also makes it possible to prevent lights emitted from the light emitting devices from interfering, and therefore it is also possible to prevent optical properties from being lowered (deteriorated).

In the light emitting apparatus according to the present invention, it is preferred that the surface roughness Ra (defined by JIS B 0601) of the first surface of the light emitting layer or the first surface of the carrier transport layer is in the range of 1 to 15 μm.

This also makes it possible to prevent lights emitted from the light emitting devices from interfering, and therefore it is also possible to prevent optical properties from being lowered (deteriorated).

In the light emitting apparatus according to the present invention, it is preferred that the roughness of the interface is formed on the first surface of the light emitting layer or the first surface of the carrier transport layer by a rough surface treatment.

According to the rough surface treatment, it is possible to form the height unevenness reliably.

In the light emitting apparatus according to the present invention, it is preferred that the rough surface treatment is a rubbing treatment or a solvent treatment.

This also makes it possible to form the height unevenness easily and reliably.

In the light emitting apparatus according to the present invention, it is preferred that the layer which has been subjected to the rough surface treatment is carried out by providing compounds having polymerizable groups, and then polymerizing the compounds.

This also makes it possible to form the height unevenness more reliably.

In the light emitting apparatus according to the present invention, it is preferred that the rough surface treatment is a rubbing treatment, and the layer which has been subjected to the rough surface treatment is carried out by performing the rubbing treatment to the compounds having the polymerizable groups before polymerization of the compounds.

This also makes it possible to form the height unevenness more reliably.

In the light emitting apparatus according to the present invention, it is preferred that the rough surface treatment is a solvent treatment, and the layer which has been subjected to the rough surface treatment is carried out by performing the solvent treatment to the compounds having the polymerizable groups which have been already polymerized.

This also makes it possible to form the height unevenness more reliably.

In the light emitting apparatus according to the present invention, it is preferred that the rough surface treatment is selectively performed on a desired area of the first surface of the light emitting layer or the first surface of the carrier transport layer with a mask.

This makes it possible to form the height unevenness to the desired area easily and reliably.

In the light emitting apparatus according to the present invention, it is preferred that the size of the light emitting layer in each of the plurality of the light emitting devices is substantially the same as with each other when the light emitting devices are viewed from the top thereof.

This helps to simplify the manufacturing process of the light emitting apparatus and reduce the production cost of the light emitting apparatus.

In the light emitting apparatus according to the present invention, it is preferred that the carrier transport layer is a layer having a function of transporting holes.

This makes it possible to greatly increase the luminous efficiency of the light emitting devices having the roughness.

In a third aspect of the present invention, there is provided electronic equipment. The electronic equipment is provided with the light emitting apparatus.

This makes it possible to obtain electronic equipment having high reliability.

DESCRIPTION OF EXEMPLARY EMBODIMENTS

Hereinbelow, a light emitting apparatus and electronic equipment according to the present invention will be described in detail with reference to the accompanying drawings.

First, description will be made with reference to an active matrix type display apparatus which is an embodiment of a light emitting apparatus in accordance with the present invention.

Figure 1:
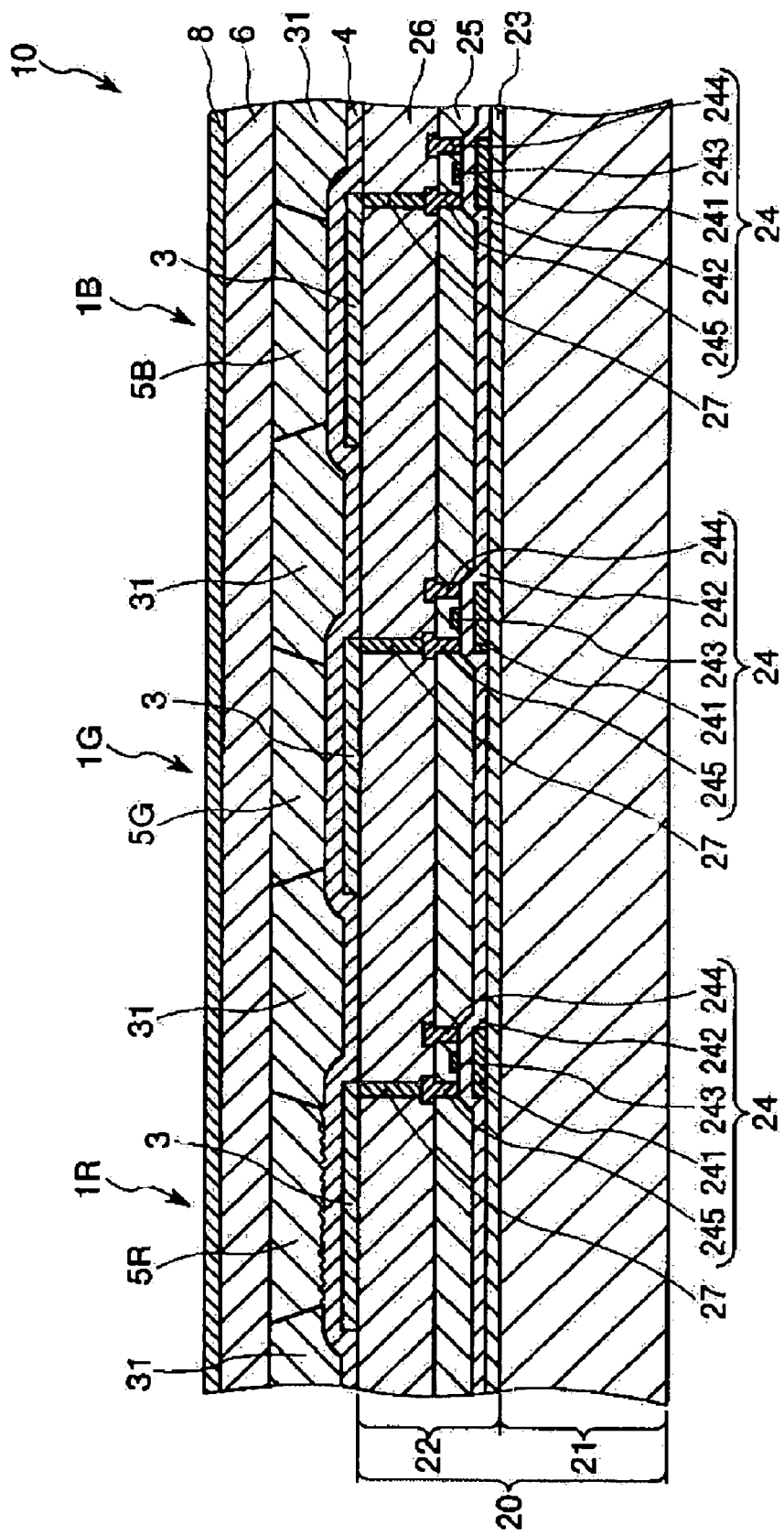
FIG. 1 is a cross-sectional view of a part of an active matrix type display apparatus which is an embodiment of a light emitting apparatus according to the present invention.
Figure 2:
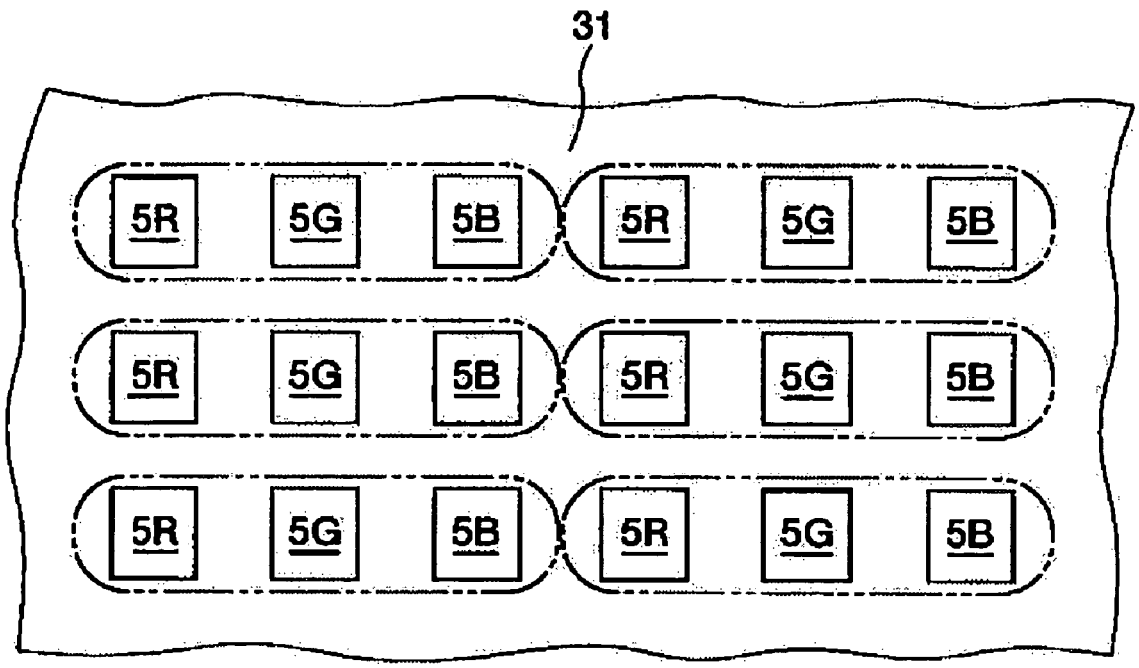
FIG. 2 is a plan view which shows a part of an arrangement of light emitting layers of the active matrix type display apparatus shown in FIG. 1.

FIG. 1 is a cross-sectional view of a part of an active matrix type display apparatus which is an embodiment of a light emitting apparatus according to the present invention. FIG. 2 is a plan view which shows a part of an arrangement of light emitting layers of the active matrix type display apparatus shown in FIG. 1.

In the following description, the upper side in FIGS. 1 and 2 will be referred to as "upper" and the lower side thereof will be referred to as "lower".

In this regard, a pixel is configured by a part of the active matrix type display shown in FIG. 1. In other words, the light emitting apparatus according to the present invention configured from a plurality of pixels.

The active matrix type display apparatus (hereinbelow, simply referred to as "display apparatus") 10 shown FIG. 1 includes a TFT circuit board 20; red light emitting devices 1R which are provided on the TFT circuit board 20 and emit a luminescent color of red (R); green light emitting devices 1G which are provided on the TFT circuit board 20 and emit a luminescent color of green (G); and blue light emitting devices 1B which are provided on the TFT circuit board 20 and emit a luminescent color of blue (B).

The TFT circuit board 20 includes a substrate 21 and a circuit section 22 formed on the substrate 21.

The substrate 21 serves as a support for each of parts constructing the display apparatus 10.

Since the display apparatus 10 according to the present embodiment has a structure (bottom emission type) in which lights are emitted from the side of the substrate 21, the substrate 21 is substantially transparent (that is, transparent and colorless, colored and transparent, or translucent).

The substrate 21 may be constituted from either of a hard substrate or a flexible substrate.

Examples of the preferable hard substrate include: various kinds of glass substrates; various kinds of ceramic substrates; various kinds of semiconductor substrates; and various kinds of high hardness resin substrates.

On the other hand, examples of the preferable flexible substrate include substrates which are mainly constituted of polyimide-based resins; polyester-based resins; polyamide-based resins; polyether-based resins such as polyether ether ketone and polyether sulfone; and the like.

Among the flexible substrates mentioned above, since polyimide-based resins have low thermal expansion coefficient and low thermal shrinkage percentage, a substrate which is constituted of polyimide-based resins as a main material thereof can suppress the thermal expansion coefficient at a low level. Further, a substrate which is constituted of polyester-based resins as a main material thereof also has a good dimensional stability.

In such a flexible substrate, it is possible to improve the dimensional stability by forming it to have a laminate structure by adding filler and fiber to the resins mentioned above or adjusting pre-heat treatment conditions and degree of cross-linking of the resins to thereby lowering the shrinkage percentage of the flexible substrate.

An average thickness of the substrate 21 is not particularly limited, but is preferably in the range of about 1 to 30 mm, and more preferably in the range of about 5 to 20 mm.

The circuit section 22 includes a protective layer 23 formed on the substrate 21, driving TFTs (switching element) 24 formed on the protective layer 23, a first insulation layer 25, and a second insulation layer 26.

The driving TFTs 24 include semiconductor layers 241, gate insulation layer 242 formed on the semiconductor layers 241, gate electrodes 243 formed on the gate insulation layer 242, source electrodes 244, and drain electrodes 245.

The red light emitting devices 1R, the green light emitting devices 1G, and the blue light emitting devices 1B are provided on the circuit section 22 having the above structure so as to be associated with the respective driving TFTs 24.

In this embodiment, anodes 3 of the red light emitting devices 1R, the green light emitting devices 1G, and the blue light emitting devices 1B constitute an individual electrode (a pixel electrode), and the anodes 3 are electrically connected to the drain electrodes 245 of the corresponding driving TFTs 24 through wirings (conduction portions) 27.

Further, the light emitting layers 5R, 5G and 5B of the adjacent light emitting devices 1R, 1G and 1B are partitioned by a partitioning wall portion (bank) 31 respectively, and they are arranged in a matrix manner when viewed from the top thereof (see FIG. 2). In FIG. 2, a pixel is formed by a portion which is surrounded by a two-point chain line (that is, one pixel is constituted of the red light emitting device 1R, the green light emitting device 1G, and the blue light emitting device 1B).

Figure 3A:
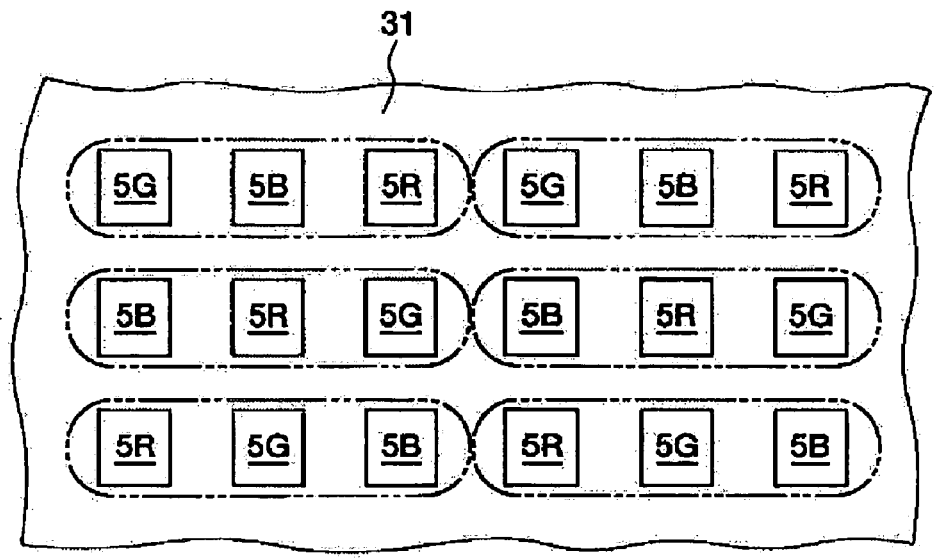
FIG. 3 is a plan view which shows a part of another arrangement of a light emitting layer.
Figure 3B:
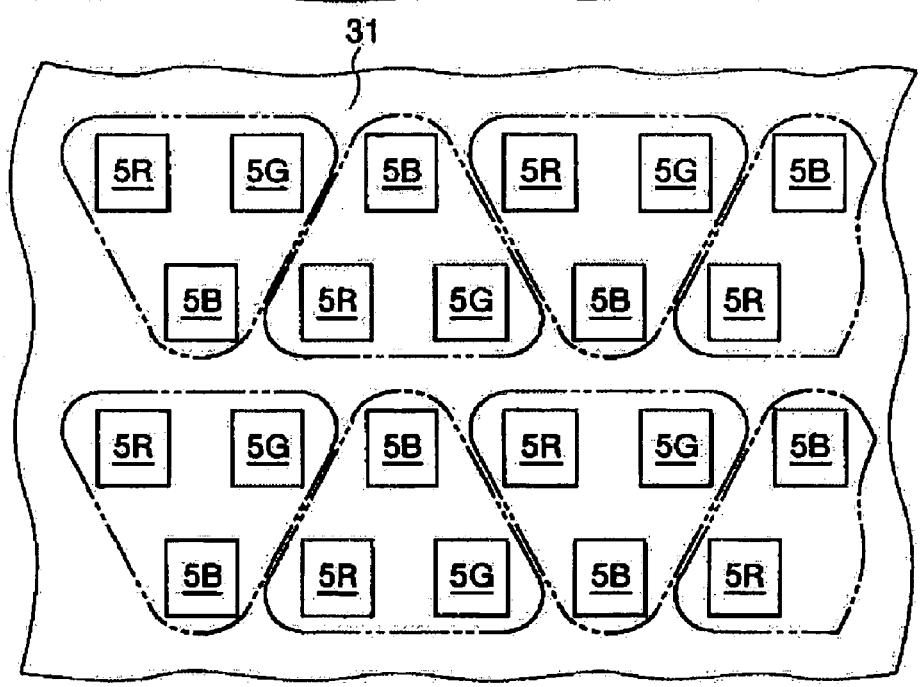

Further, the arrangement of the red light emitting layers 5R, the green light emitting layers 5G, and the blue light emitting layers 5B is not limited to the arrangement as shown in FIG. 2. For example, the arrangements as shown in FIG. 3A and FIG. 3B may be employed.

In each pixel, the red light emitting layer 5R, the green light emitting layer 5G, and the blue light emitting layer 5B are formed so as to have substantially the same size (when viewed from the top thereof). This makes it possible to easily form the partitioning wall portion 31, so that it helps to simplify a manufacturing process of the display apparatus 10 and reduce the manufacturing cost of the display apparatus 10.

Hereinbelow, the red light emitting devices 1R, the green light emitting devices 1G, and the blue light emitting devices 1B will be described in detail based on FIG. 1. In this regard, it is to be noted that FIG. 1 shows a structure of one pixel comprised of the red light emitting device 1R, the green light emitting device 1G, and the blue light emitting device 1B.

As shown in FIG. 1, the red light emitting device 1R, the green light emitting device 1G, and the blue light emitting device 1B include individual anodes 3; a common cathode 8; a common hole transport layer 4, individual light emitting layers 5 (red light emitting layer 5R, green light emitting layer 5G, and blue light emitting layer 5B), and a common electron transport layer 6. These layers are arranged between the anodes 3 and the cathode 8 in this order from the side of the anodes 3.

Hereinafter, the red light emitting device 1R, the green light emitting device 1G, and the blue light emitting device 1B are collectively referred to as a light emitting device 1 on occasions. Further, the red light emitting layer 5R, the green light emitting layer 5G, and the blue light emitting layer 5B are collectively referred to as a light emitting layer 5 on occasions.

The anodes 3 (a second electrode) are an electrode which injects holes into the hole transport layer 4.

A material having a high work function, excellent conductivity, and a light transmitting property is preferably used as a constituent material of the anodes 3 (hereinafter, referred to as "anode material").

Examples of such an anode material include oxides such as ITO (complex is produced by Indium Oxide and Tin Oxide), $SnO_2$, Sb-containing $SnO_2$, and Al-containing ZnO; Au, Pt, Ag, Cu, and alloys containing two or more of them. At least one of these materials can be used as the anode material.

The average thickness of each anode 3 is not limited to any specific value, but is preferably in the range of about 10 to 200 nm, and more preferably in the range of about 50 to 150 nm. If the thickness of the anode 3 is too thin, there is a case that a function of the anode 3 will not be sufficiently exhibited.

On the other hand, if the thickness of the anode 3 is too thick, there is a case that the light transmittance will be significantly lowered depending on the kind of the anode material used. If anodes having such a larger thickness are used in bottom emission type light emitting devices 1R, 1G and 1B, there may be a case that a display apparatus 10 manufactured using the light emitting devices 1R, 1G and 1B is not suitable for practical use.

Further, it is to be noted that conductive resins such as polythiophene, polypyrrole, and the like can also be used as the anode material.

On the other hand, the cathode 8 (a first electrode) is an electrode which injects electrons into the electron transport layer 6.

As a constituent material of the cathode 8 (hereinafter, referred to as "cathode material"), a material having a low work function is preferably used.

Examples of such a cathode material include Li, Mg, Ca, Sr, La, Ce, Er, Eu, Sc, Y, Yb, Ag, Cu, Al, Cs, Rb, and alloys containing two or more of them. At least one of these materials can be used as the cathode material.

Particularly, in the case where the alloys are used as the cathode material, alloys containing a stable metallic element such as Ag, Al, Cu, or the like, specifically the alloys such as MgAg, AlLi, or CuLi are preferably used. The use of such alloys as the cathode material makes it possible to improve the electron injection efficiency and stability of the cathode 8.

The average thickness of the cathode 8 is not limited to any particular value, but is preferably in the range of about 100 to 3000 nm, and more preferably in the range of about 500 to 2000 nm. If the thickness of the cathode 8 is too thin, there is a fear that a function of the cathode 8 will not be sufficiently exhibited.

The cathode 8 may be formed into a laminated structure comprised of a plurality of layers. In this case, it is preferred that the cathode material having a lower work function is used in a layer in the laminated structure near the electron transport layer 6.

For example, in the case where the cathode 8 is formed into the laminated structure of two layers, one layer far from the electron transport layer 6 can be constituted of calcium as a main material thereof, and the other layer near the electron transport layer 6 can be constituted of Al, Ag, or alloys containing them as a main material thereof.

In the cathode 8 having such a structure described above, the other layer near the electron transport layer 6 may be used as a light reflecting layer which reflects light emitted from each light emitting layer 5 to the side of the TFT circuit board 20. This makes it possible to increase luminous efficiency (emission efficiency of light) of the display apparatus 10 (the red light emitting devices 1R, the green light emitting devices 1G, and the blue light emitting devices 1B).

Further, between the cathode 8 and the electron transport layer 6, an auxiliary cathode may be provided in order to prevent water, metal materials and the like from diffusing to the electron transport layer 6 and the light emitting layer 5. The auxiliary cathode also serves to complement the function of the cathode 8.

In this case, it is preferred that a constituent material of the auxiliary cathode is constituted of fluoride of a metal element belonging to the 1A family or the 2A family of the periodic table as a main material thereof. Examples of such a constituent material include LiF, NaF, KF, RbF, CsF, $BaF_2$, $CaF_2$, $SrF_2$, $MgF_2$, and the like.

The average thickness of the auxiliary cathode is not limited to a particular value, but is preferably in the range of about 0.1 to 10 nm, and more preferably in the range of about 0.1 to 5 nm.

The hole transport layer 4 has a function of transporting holes, which are injected from the anodes 3, to the light emitting layers 5.

As a constituent material of the hole transport layer 4 (hole transport material), various high molecular materials or various low molecular materials can be used singly or in combination of two or more of them.

Examples of such high molecular materials of the hole transport material include: resins containing arylamine skeleton such as polyarylamine; resins containing fluorene skeleton such as fluorene-bithiophene copolymer; resins containing both the arylamine skeleton and the fluorene skeleton such as fluorene-arylamine copolymer; resins such as poly (N-vinylcarbazole), polyvinylpyrene, polyvinylanthracene, polythiophene, polyalkylthiophene, polyhexylthiophene, poly(p-phenylenevinylene), polythinylenevinylene, pyreneformaldehyde, ethylcarbazolformaldehyde, and the derivatives thereof; and the like.

Furthermore, as a mixture of the hole transport material and others compounds, for example, a mixture containing polythiophene can be used. Examples of the mixture include poly(3,4-ethylenedioxythiophene/styrenesulfonic acid) (PEDOT/PSS) and the like.

Examples of such low molecular materials of the hole transport material include arylcycloalkane-based compounds such as 1,1-bis(4-di-para-triaminophenyl)cyclohexane and 1,1'-bis(4-di-para-tolylaminophenyl)-4-phenyl-cyclohexane; arylamine-based compounds such as 4,4',4"-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine(TPD1), N,N'-diphenyl-N,N'-bis(4-methoxyphenyl)-1,1'-biphenyl-4,4'-diamine(TPD2), N,N,N', N'-tetrakis(4-methoxyphenyl)-1,1'-biphenyl-4,4'-diamine (TPD3), N,N'-di(1-naphthyl)-N,N'-diphenyl-1,1'-biphenyl-4,4'-diamine(α-NPD), TPTE, and 4,4',4"-tris(1-naphthylphenylamino)-triphenylamine(1-TNATA); phenylenediamine-based compounds such as N,N,N',N'-tetraphenyl-para-phenylenediamine, N,N,N',N'-tetra(paratolyl)-para-phenylenediamine, and N,N,N',N'-tetra(metatolyl)-meta-phenylenediamine(PDA); carbazole-based compounds such as carbazole, N-isopropylcarbazole, and N-phenylcarbazole; stilbene-based compounds such as stilbene, and 4-di-para-tolylaminostilbene; oxazole-based compounds such as $O_xZ$; triphenylmethane-based compounds such as triphenylmethane, and m-MTDATA; pyrazoline-based compounds such as 1-phenyl-3-(para-dimethylaminophenyl)pyrazoline; benzine(cyclohexadiene)-based compounds; triazole-based compounds such as triazole; imidazole-based compounds such as imidazole; oxadiazole-based compounds such as 1,3,4-oxadiazole, and 2,5-di(4-dimethylaminophenyl)-1,3,4-oxadiazole; anthracene-based compounds such as anthracene, and 9-(4-diethylaminostyryl) anthracene; fluorenone-based compounds such as fluorenone, 2,4,7-trinitro-9-fluorenone, and 2,7-bis(2-hydroxy-3-(2-chlorophenylcarbamoyl)-1-naphthylazo)fluorenone; aniline-based compounds such as polyaniline; silane-based compounds; pyrrole-based compounds such as 1,4-dithioketo-3,6-diphenyl-pyrrolo-(3,4-c)pyrrolopyrrole; florene-based compounds such as florene; porphyrin-based compounds such as porphyrin, and metal tetraphenylporphyrin; quinacridon-based compounds such as quinacridon; metallic or non-metallic phthalocyanine-based compounds such as phthalocyanine, copper phthalocyanine, tetra(t-butyl) copper phthalocyanine, and iron phthalocyanine; metallic or non-metallic naphthalocyanine-based compounds such as copper naphthalocyanine, vanadyl naphthalocyanine, and monochloro gallium naphthalocyanine; and benzidine-based compounds such as N,N'-di(naphthalene-1-yl)-N,N'-diphenyl-benzidine and N,N,N',N'-tetraphenylbenzidine.

The average thickness of the hole transport layer 4 is not limited to any specific value, but is preferably in the range of about 10 to 150 nm, and more preferably in the range of about 50 to 100 nm.

Further, a hole injecting layer for improving the injection efficiency of holes from the anodes 3 may be provided between the hole transport layer 4 and the anodes 3.

As a constituent material (hole injecting material) of the hole injecting layer, for example, copper phthalocyanine, 4,4',4''-tris(N,N-phenyl-3-methylphenylamino)triphenylamine (m-MTDATA), or the like can be used.

The electron transport layer 6 has a function of transporting electrons, which are injected from the cathode 8, to the light emitting layers 5.

Examples of such a material (electron transport material) that can be used for the electron transport layer 6 include: benzene-based compounds (starburst-based compounds) such as 1,3,5-tris[(3-phenyl-6-tri-fluoromethyl)quinoxaline-2-yl]benzene (TPQ1), and 1,3,5-tris[{3-(4-t-butylphenyl)-6-trisfluoromethyl}quinoxaline-2-yl]benzene (TPQ2); naphthalene-based compounds such as naphthalene; phenanthrene-based compounds such as phenanthrene; chrysene-based compounds such as chrysene; perylene-based compounds such as perylene; anthracene-based compounds such as anthracene; pyrene-based compounds such as pyrene; acridine-based compounds such as acridine; stilbene-based compounds such as stilbene; thiophene-based compounds such as BBOT; butadiene-based compounds such as butadiene; coumarin-based compounds such as coumarin; quinoline-based compounds such as quinoline; bistyryl-based compounds such as bistyryl; pyrazine-based compounds such as pyrazine and distyrylpyrazine; quinoxaline-based compounds such as quinoxaline; benzoquinone-based compounds such as benzoquinone, and 2,5-diphenyl-para-benzoquinone; naphthoquinone-based compounds such as naphthoquinone; anthraquinone-based compounds such as anthraquinone; oxadiazole-based compounds such as oxadiazole, 2-(4-biphenylyl)-5-(4-t-butylphenyl)-1,3,4-oxadiazole (PBD), BMD, BND, BDD, and BAPD; triazole-based compounds such as triazole, and 3,4,5-triphenyl-1,2,4-triazole; oxazole-based compounds; anthrone-based compounds such as anthrone; fluorenone-based compounds such as fluorenone, and 1,3,8-trinitro-fluorenone (TNF); diphenoquinone-based compounds such as diphenoquinone, and MBDQ; stilbenequinone-based compounds such as stilbenequinone, and MBSQ; anthraquinodimethane-based compounds; thiopyran dioxide-based compounds; fluorenylidenemethane-based compounds; diphenyldicyanoethylene-based compounds; florene-based compounds such as florene; metallic or non-metallic phthalocyanine-based compounds such as phthalocyanine, copper phthalocyanine, and iron phthalocyanine; various metal complexes such as 8-hydroxyquinoline aluminum ($Alq_3$), and complexes having benzooxazole or benzothiazole as a ligand; and the like.

In addition to the above mentioned constituent materials of the electron transport layer 6 (electron transport material), polymers such as oxadiazole-based polymer (polyoxadiazole), triazole-based polymer (polytriazole), and the like may be used.

The average thickness of the hole transport layer 6 is not limited to any specific value, but is preferably in the range of about 1 to 100 nm, and more preferably in the range of about 20 to 50 nm.

Further, an electron injecting layer for improving the injection efficiency of electrons from the cathode 8 may be provided between the electron transport layer 6 and the cathode 8.

Examples of a constituent material (electron injecting material) of the electron injecting layer other than various organic materials include various inorganic insulating materials, various inorganic semiconductor materials, and the like.

Use of the inorganic insulating materials or the inorganic semiconductor materials as a main material of the electron injecting layer makes it possible to effectively prevent leakage of current, so that this helps to improve the performance of injecting electrons, and improve the durability of the electron injecting layer.

Examples of such inorganic insulating materials include: alkali metal chalcogenides (oxides, sulfides, selenids, and tellurides); alkali-earth metal chalcogenides; halogen compounds of alkali metal; halogen compounds of alkali-earth metal. These compounds may be used singly or in combination of two or more of them.

Use of these materials as a main material of the electron injecting layer makes it possible to greatly improve the performance of injecting electrons.

Examples of alkali metal chalcogenides include $Li_2O$, LiO, $Na_2S$, $Na_2Se$, NaO, and the like.

Examples of alkali-earth metal chalcogenides include CaO, BaO, SrO, BeO, BaS, MgO, CaSe, and the like.

Examples of halogen compounds of alkali metal include CsF, LiF, NaF, KF, LiCl, KCl, NaCl, and the like.

Examples of halogen compounds of alkali-earth metal include $CaF_2$, $BaF_2$, $SrF_2$, $MgF_2$, $BeF_2$, and the like.

Further, examples of the inorganic semiconductor materials include: oxides, nitrides, oxide-nitrides, or the like containing at least one element among Ba, Ca, Sr, Yb, Al, Ga, In, Li, Na, Cd, Mg, Si, Ta, Sb, and Zn. These compounds may be used singly or in combination of two or more of them.

In the case where the electron injecting layer is constituted of the inorganic insulating materials and the inorganic semiconductor materials as described above, it is preferred that the inorganic insulating materials and the inorganic semiconductor materials are microcrystal or amorphous. This makes it possible to increase the homogeneity of the electron injecting layer, thereby reducing defects such as dark spots and the like in the pixels.

When a current flows between the anodes 3 and the cathode 8 (that is, a voltage is applied across the anodes 3 and the cathode 8), holes move in the hole transport layer 4 and electrons move in the electron transport layer 6, and the holes and the electrons are then recombined in the light emitting layers 5. Then, in the light emitting layers 5, excitons (exciters) are generated by the energy released upon the recombination of the holes and the electrons, and the excitons release energy (in the form of fluorescence or phosphorescence) or emit light when returning to the ground state.

Various low-molecular materials and various high-molecular materials can be used singly or in combination of two or more of them respectively as a constituent material (light emitting materials) of the light emitting layers 5 (5R, 5G, 5B).

Examples of such high-molecular materials of the light emitting materials include: polyacetylene-based compounds such as trans-type polyacetylene, cis-type polyacetylene, poly(di-phenylacetylene) (PDPA), and poly(alkyl, phenylacetylene) (PAPA); polyparaphenylenevinylene-based compounds such as poly(para-phenylenevinylene) (PPV), poly(2,5-dialkoxy-para-phenylenevinylene) (RO-PPV) which includes poly[2,5-bis(3,7-dimethyloctyloxy)-1,4-phenylenevinylene], cyano-substituted-poly(para-phenylenevinylene) (CN-PPV), poly(2-dimethyloctylsilyl-para-phenylenevinylene) (DMOS-PPV), and poly(2-methoxy-5-(2'-ethylhexoxy)-para-phenylenevinylene) (MEH-PPV); polythiophene-based compounds such as poly(3-alkylthiophene) (PAT), and poly(oxypropylene)triol (POPT); polyfluorene-based compounds such as poly(9,9-dialkylfluorene) (PDAF), α,ω-bis[N,N'-di(methylphenyl)aminophenyl]-poly[9,9-bis(2-ethylhexyl)fluorene-2,7-diyl] (PF2/6am4), poly(9,9-dioctyl-2,7-divinylenefluorenyl)-ortho-co(anthracene-9,10-diyl), poly(9,9-dihexyl-2,7-vinylenefluorenylene), and poly[(9,9-dioctylfluorene-2,7-diyl)-co-(2,5-dimethoxybenzene-1,4-diyl)]; polyparaphenylene-based compounds such as poly(para-phenylene) (PPP), and poly(1,5-dialkoxy-paraphenylene) (RO-PPP); polycarbazole-based compounds such as poly(N-vinylcarbazole) (PVK); and polysilane-based compounds such as poly(methylphenylsilane) (PMPS), poly(naphthylphenylsilane) (PNPS), and poly(biphenylylphenylsilane) (PBPS); and the like.

Examples of such low-molecular materials of the light emitting materials include: benzene-based compounds such as distyrylbenzene (DSB), diaminodistyrylbenzene (DADSB), and 4,4'-bis(9-ethyl-3-carbazovinylene)-1,1'-biphenyl; naphthalene-based compounds such as naphthalene and Nile red; phenanthrene-based compounds such as phenanthrene; chrysene-based compounds such as chrysene and 6-nitrochrysene; perylene-based compounds such as perylene and N,N'-bis(2,5-di-t-butylphenyl)-3,4,9,10-perylene-di-carboxylmide (BPPC); coronene-based compounds such as coronene; anthracene-based compounds such as anthracene, bisstyrylanthracene, and 9,10-bis[(9-ethyl-3-carbzole)-vinylenyl]-anthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzooxazolethiophene; benzooxazole-based compounds such as benzooxazole; benzoimidazole-based compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; spiro compounds such as 2,2',7,7'-tetraphenyl-9,9'-spirobifluorene; metallic or non-metallic phthalocyanine-based compounds such as phthalocyanine ($H_2Pc$) and copper phthalocyanine; florene-based compounds such as florene; and various metallic complexes such as 8-hydroxyquinoline aluminum ($Alq_3$), tris(4-methyl-8-quinolinolate) aluminum(III) ($Almq_3$), (8-hydroxyquinoline) zinc ($Znq_2$), (1,10-phenanthroline)-tris-(4,4,4-trifluoro-1-(2-thienyl)-butane-1,3-dionate) europium (III) ($Eu(TTA)_3$ (phen)), fac-tris(2-phenylpyridine) iridium ($Ir(ppy)_3$), (2,3,7,8,12,13,17,18-octaethyl-21H,23H-porphin) platinum(II), and tris(1-phenylisoquinoline) iridium (III), and the like.

Among the light emitting materials described above, light emitting materials that can emit objective luminescent colors may be selected as the constituent material each of the red light emitting layers 5R, the green light emitting layers 5G, and the blue light emitting layers 5B.

Examples of the red light emitting materials (constituent material of the red light emitting layers 5R) include: tris(1-phenylisoquinoline) iridium (III), poly[2,5-bis(3,7-dimethyloctyloxy)-1,4-phenylenevinylene], poly[2-methoxy-5-(2'-ethylhexyloxy)-1,4-(1-cyanovinylene)phenylene], poly[2-methoxy-5-(3,7-dimethyloctyloxy)-1,4-phenylenevinylene], and the like.

Examples of the green light emitting materials (constituent material of the green light emitting layers 5G) include: 9,10-bis[(9-ethyl-3-carbazole)-vinylenyl]-anthracene, poly(9,9-dihexyl-2,7-vinylenefluorenylene), poly[9,9-dioctylfluorene-2,7-diyl]-co-(1,4-diphenylene-vinylene-2-methoxy-5-{2-ethylhexyloxy}benzene)], poly[(9,9-dioctyl-2,7-divinylenefluorenylen-ortho-co-(2-methoxy-5-(2-ethoxy]hexyloxy)-1,4-phenylene), and the like.

Examples of the blue light emitting materials (constituent material of the blue light emitting layers 5B) include: 4,4'-bis(9-ethyl-3-carbazovinylene)-1,1'-biphenyl, poly[(9,9-dioctylfluorene-2,7-diyl)-co-(2,5-dimethoxybenzene-1,4-diyl)], poly[9,9-dihexyloxyfluorene-2,7-diyl]-ortho-co-(2-methoxy-5-{2-ethoxyhexyloxy}phenylene-1,4-diyl)], poly[(9,9-dioctylfluorene-2,7-diyl)-co-(ethylnylbenzene)], and the like.

In the case where the low-molecular materials are used as the light emitting materials, it is preferred that all of the red light emitting layers 5R, the green light emitting layers 5G, and the light emitting layers 5B are constituted of the low-molecular materials respectively. In the case where the high-molecular materials are used as the light emitting materials, it is preferred that all of the red light emitting layers 5R, the green light emitting layers 5G, and the light emitting layers 5B are constituted of the high-molecular materials, respectively.

Further, the average thickness of each of the light emitting layers 5 is not limited to any specific value, but is preferably in the range of about 10 to 150 nm, and more preferably in the range of about 50 to 100 nm.

Furthermore, a seal member which is not shown in the drawings is joined to the substrate 21 so as to cover the whole of the light emitting devices 1, thereby sealing the whole of the light emitting devices 1.

This seal member has a function to shut off oxygen and moisture, so that the seal member prevents each part (the layers 3, 4, 5, 6, and 8) constituting each of the light emitting devices 1 from alternating and deteriorating. As a result, this helps to improve the reliability and the durability of the light emitting devices 1.

Au, Cr, Nb, Ta and Ti, alloys containing them, silicon oxide, various resin materials, and the like.

Further, the seal member may be formed into a flat plate shape, and provided on the cathode 8 so as to face the TFT circuit board 20 so that a space is created between the seal member and around the layers, and then the space is filled with a seal material such as thermosetting resin or the like to thereby seal the light emitting devices 1.

Hereinbelow, an aspect of the present invention will be described. The aspect of the preset inventions is directed to a light emitting apparatus which is provided with a plurality of light emitting devices for emitting a plurality of predetermined different colors, wherein the plurality of light emitting devices include light emitting devices for at least one predetermined color, wherein the interface of each of the light emitting devices for the at least one predetermined color is formed into a roughened surface, and wherein the roughness of the interfaces of the light emitting devices for the at least one predetermined color is set so that the luminous brightness of the light emitting devices for the respective colors becomes substantially equal to each other when a substantially same voltage is applied thereto.

In the embodiment shown in FIG. 1, such roughness is formed on the interface between the hole transport layer (carrier transport layer having the function of transporting holes) 4 and the red light emitting layer 5R in each of the red light emitting devices 1R, while no roughness is formed on the interface between the hole transport layer 4 and the green light emitting layer 5G in each of the green light emitting devices 1G as well as on the interface between the hole transport layer 4 and the blue light emitting layer 5B in each of the blue light emitting devices 1B.

In this way, the luminance brightness of each of the red light emitting devices 1R, the green light emitting devices 1G and the blue light emitting devices 1B becomes substantially equal to each other when the substantially same voltage is applied to the respective light emitting devices 1R, 1G and 1B.

In this regard, it is to be noted that if the roughness exists on the interface between the hole transport layer 4 and the red light emitting layer 5R in each red light emitting devices 1R, contact area between the layers 4 and 5 is increased and thereby the injecting efficiency of holes to each red light emitting layer 5R is increased. As a result, the light emitting efficiency (luminous brightness) of the red light emitting layers 5R is increased.

Accordingly, in the case where the light emitting apparatus of this embodiment having the above structure is applied to the case where light emitting materials to be used have such characteristics that luminous brightness of red color is lowest, luminous brightness of each of green and blue colors is higher than the luminous brightness of the red color, and the luminous brightness of the green color and the luminous brightness of the blue color are substantially the same with each other, and such light emitting materials are respectively used as the light emitting materials for the light emitting devices for the respective colors 1R, 1G and 1B, the luminous brightness of red color is increased due to the presence of the roughness on the interface of each of the red light emitting devices 1R.

As a result, the luminous brightness of each color can be made (or adjusted to be) substantially equal to each other when a substantially same voltage is applied to the light emitting devices for the respective colors 1R, 1G and 1B.

Generally, there is a tendency that most of red light emitting materials have low luminous brightness. Therefore, this embodiment having the above structure is preferably used in the display apparatus 10 of the present invention.

In the foregoing, the description was made with regard to the embodiment of the display apparatus 10 where the roughness is formed on the interface between the hole transport layer 4 and the red light emitting layer 5R only in the red light emitting devices 1R. The present invention is not limited to the structure.

Namely, in the present invention, such roughness may be also formed on the interface between the hole transport layer 4 and the light emitting layer 5 of each of the green light emitting devices 1G and the blue light emitting devices 1B in addition to the red light emitting devices 1R. In this modification, the degree of the roughness on the interface between the hole transport layer 4 and the light emitting layers 5 of each of the light emitting devices 1R, 1G and 1B is adjusted so that the luminance brightness of each of the light emitting devices 1R, 1G and 1B becomes substantially equal to each other when the substantially same voltage is applied to the respective light emitting devices 1R, 1G and 1B.

For example, in the light emitting apparatus of the embodiment as described above, roughness may be also formed on the interface between the hole transport layer 4 and the light emitting layer 5 of each of the green light emitting devices 1G and the blue light emitting devices 1B. In such a case, the degree of the roughness for the green light emitting devices 1G and the blue light emitting devices 1B is substantially the same as with each other, but it is considerably smaller than the degree of the roughness for the red light emitting devices 1R.

Further, in an alternative example where light emitting materials to be used have such characteristics that luminous brightness of red color is lowest, luminous brightness of blue color is highest, and the luminous brightness of green color is a middle level therebetween, and such light emitting materials are used as the light emitting materials for the light emitting devices for the respective colors 1R, 1G and 1B, the degree of the roughness for each of the light emitting devices for the respective colors 1R, 1G and 1B is set so that the roughness for the red light emitting devices 1R is largest, the roughness for the blue light emitting devices 1B is smallest, and the roughness for the green light emitting devices 1G is set to be a degree therebetween.

As described above, in the embodiment, the roughness is formed on the interface between the hole transport layer 4 and each light emitting layer 5. In other words, the roughness is formed on one surface of the hole transport layer 4 in contact with each red light emitting layer 5R and/or one surface of each red light emitting layer 5R in contact with the hole transport layer 4.

In this regard, description will be made on the case where numbers of minute convex portions 41 which constitute the roughness are formed on one surface of the hole transport layer 4 in contact with each light emitting layer 5, that is, the top surface of the hole transport layer 4.

Figure 4:
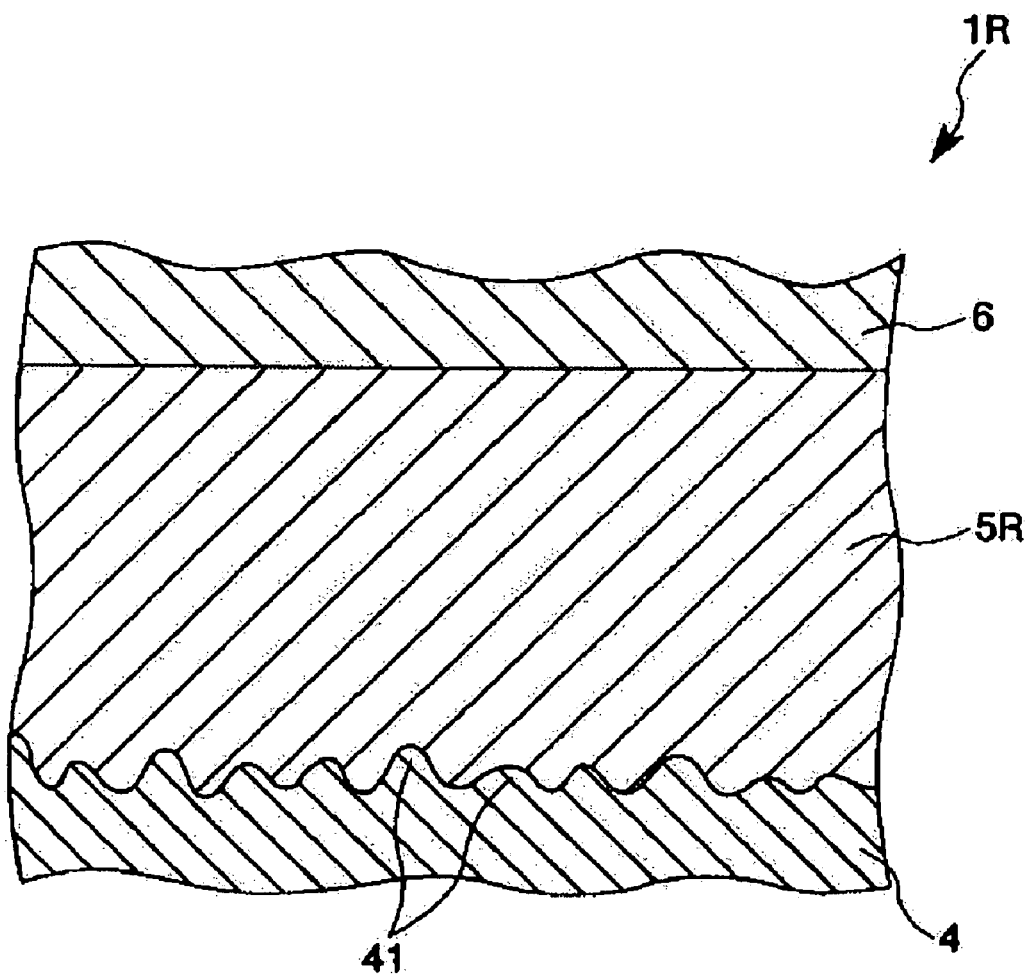
FIG. 4 is an enlarged cross-sectional view of a part of a red light emitting device of the active matrix type display apparatus shown in FIG. 1.

As shown in FIG. 4, the numbers of minute convex portions 41 are present on the top surface of the hole transport layer 4 so as to have height unevenness due to uneven density distribution of the formed convex portions 41 on the top surface of the hole transport layer 4 and uneven surface roughness Ra (defined by JIS B 0601) of the top surface of the hole transport layer 4.

This makes it possible to prevent lights emitted from the red light emitting devices 1R from interfering, and therefore it is also possible to prevent optical properties from being lowered (deteriorated) appropriately.

The density of the convex portions 41 formed on the top surface of the hole transport layer 4 is not limited to any specific value, but is preferably in the range of about 70 to $1 \times 10^6$ pieces per 1 mm$^2$, and more preferably in the range of about $1 \times 10^2$ to $4 \times 10^4$ pieces per 1 mm$^2$.

The surface roughness Ra of the top surface of the hole transport layer 4 is also not limited to any specific value, but is preferably in the range of about 1 to 15 μm, and more preferably in the range of about 5 to 10 μm.

If either of the density of the convex portions 41 formed on the top surface of the hole transport layer 4 and the surface roughness Ra of the top surface of the hole transport layer 4 satisfies the above-noted range, it is possible to greatly improve the effects noted above. Further, if both the density of the formed convex portions 41 and the surface roughness Ra of the top surface of the hole transport layer 4 satisfy the above-noted range, it is possible to more greatly improve the effects described above.

In this regard, it is to be noted that the roughness may be formed from convex portions 41 irregularly or unevenly formed on the top surface of the transport layer 4 by either of variations in the density of the convex portions 41 on the top surface of the hole transport layer 4 or variations in the surface roughness Ra of the top surface of the hole transport layer 4 within the area of the top surface of the hole transport layer 4 for each light emitting device.

The convex portions 41 may be in the form of ridges (ribs) extending from a front side to a back side of each sheet of FIG. 1 and FIG. 4, or may be in the form of scattered minute projections.

In the foregoing, description was made with regard to the embodiment having the structure in which the roughness is formed on the interface between the hole transport layer 4 and the light emitting layer 5, but in the present invention the roughness may be formed on an interface between the light emitting layer 5 and the electron transport layer (carrier transport layer having the function of transporting electrons) 6, or the roughness may be formed on both the interface between the hole transport layer 4 and the light emitting layer 5 and the interface between the light emitting layer 5 and the electron transport layer 6.

If the roughness is formed on the interface between the light emitting layer 5 and the electron transport layer 6, the contact area between the electron transport layer 6 and the light emitting layer 5 is increased and thereby the injecting efficiency of electrons to the light emitting layer 5 is increased. As a result, the light emitting efficiency (luminous brightness) is also increased.

In this regard, please note that through the research made by the inventors of this application it has been confirmed that there is a tendency that the luminous brightness is well improved when the roughness is formed on the interface between the hole transport layer 4 and the light emitting layer 5 as compared to the case where the roughness is formed on the interface between the light emitting layer 5 and the electron transport layer 6 though this tendency relies on the constituent material of the respective layers 4, 5 and 6.

In connection with this, it is to be noted that the luminous brightness of each of the light emitting materials to be used can be known beforehand through an experiment. Further, a relation between a degree of the rising of the luminous brightness and a layer on which roughness is to be formed including a density of convex portions forming the roughness and the surface roughness Ra of the layer can be also known beforehand by an experiment.

Further, for example, in the case where in one light emitting device a periphery of the light emitting device is relatively dark and an inside of the light emitting device is bright when the light emitting device is viewed from the top thereof, the density of the convex portions 41 may be set so that the density of the convex portions in the periphery of the top surface of the hole transport layer 4 is higher than the density of the convex portions in the inside of the top surface of the hole transport layer 4 to thereby make the luminous brightness level in the one light emitting device uniform.

Furthermore, for example, in the case where in another light emitting device a periphery of the light emitting device is bright and an inside of the light emitting device is relatively dark when the light emitting device is viewed from the top thereof, the density of the convex portions 41 may be set so that the density of the convex portions in the inside of the top surface of the hole transport layer 4 is higher than the density of the convex portions in the periphery of the top surface of the hole transport layer 4 to thereby make the luminous brightness level of the inside of the light emitting device become higher than the luminous brightness level of the periphery of the light emitting device.

As described above, according to the present invention, it is possible to increase or raise the luminous brightness of the light emitting devices 1 with the simple structure that the roughness is formed on the interface between the light emitting layer 5 and the carrier transport layer (the hole transport layer 4 or the electron transport layer 6).

Further, in each of the red light emitting devices 1R, the green light emitting devices 1G, and the blue light emitting devices 1B, by adjusting a degree of the roughness of the interfaces between the light emitting layers and the carrier transport layers thereof appropriately, it is possible to configure the red light emitting devices 1R, the green light emitting devices 1G, and the blue light emitting devices 1B so that they can emit lights each having substantially equal luminous brightness when substantially the same voltage is applied thereto.

Namely, according to the present invention, the red light emitting devices 1R, the green light emitting devices 1G, and the blue light emitting devices 1B can emit lights having substantially the same luminous brightness without using a complex controlling circuit which changes an applied voltage in each of the red light emitting devices 1R, the green light emitting devices 1G, and the blue light emitting devices 1B.

Further, as one method for equalizing the luminous brightness of the respective light emitting devices with substantially the same applied voltage, a person having ordinary skill in the art may conceive a structure in which a size of a light emitting layer of each of light emitting devices having low luminous brightness (when viewed from a top thereof) is formed to be larger than a size of a light emitting layer of each of other light emitting devices.

However, according to the present invention, it is not necessary to adopt such a structure, that is, it is not necessary to design or determine sizes of red light emitting devices 1R, green light emitting devices 1G, and blue light emitting devices 1B individually when manufacturing the light emitting devices.

In this way, the present invention can prevent the structures of the light emitting devices 1 and the whole of the display apparatus 10 from complicating, thereby enabling to reduce cost and time required for manufacturing the display apparatus 10.

Further, since the roughness is formed on the interface between the light emitting layer 5 and the carrier transport layer (the hole transport layer 4 or the electron transport layer 6), contact area (emitting light site) between the light emitting layer 5 and the carrier transport layer is increased and therefore the injecting efficiency of holes to the light emitting layer 5 is increased. As a result, the light emitting efficiency (luminous brightness) of the light emitting layer 5 is increased. Therefore, a voltage applied to the light emitting devices 1 having the roughness on an interface between a light emitting layer and a carrier transport layer thereof may be lower than a voltage applied to light emitting devices having no roughness on the interface thereof. As a result, degradation of the light emitting materials is difficult to occur and therefore it is possible to lengthen the duration of life of the light emitting devices 1 (display apparatus 10).

The display apparatus 10 as described above can be manufactured according to the following manner, for example.

Hereinafter, description will be made with regard to a method for manufacturing the display apparatus 10.

<1> First, the substrate 21 is prepared, and then the protective layer 23 which is constituted of oxide silicon as a main material thereof is formed on the substrate 21 so as to have the average thickness in the range of about 200 to 500 nm by plasma CVD or the like using, for example, a raw gas such as TEOS (tetraethoxysilane), oxygen gas, or the like.

Next, the driving TFTs 24 are formed on the protective layer 23.

First, a semiconductor layer which is constituted of amorphous silicon as a main material thereof is formed on the protective layer 23 so as to have the average thickness in the range of about 30 to 70 nm, for example, by plasma CVD in a state that the substrate 21 is heated at a temperature of about 350° C.

Next, the semiconductor layer is crystallized by a laser-anneal method, a solid-phase growth method, or the like, thereby altering the amorphous silicon to polysilicon.

In this regard, in the case where the laser-anneal method is used, the length of line-beam in excimer laser is set to 400 nm, and output intensity of the line-beam is set to about 200 mJ/cm$^2$. The line-beam is scanned so that portions which correspond to 90% of laser maximum intensity in the line-beam overlaps with areas to be crystallized in the semiconductor layer.

Next, the semiconductor layer is patterned so as to have a plurality of island shaped portions to obtain semiconductor layers 241, and then the gate insulation layer 242 which is constituted of oxide silicon, nitride silicon, or the like as a main material thereof is formed with the average thickness in the range of about 60 to 150 nm so as to cover the island shaped portions of the semiconductor layers 241 by plasma CVD or the like using, for example, a raw gas such as TEOS (tetraethoxysilane), oxygen gas, or the like.

Next, a conducting layer which is constituted of metal such as aluminium, tantalum, molybdenum, titanium, and tungsten as a main material thereof is formed on the gate insulation layer 242, and thereafter patterning is made on the conducting layer to form gate electrodes 243.

Next, in each of the gate electrodes 243 in a state that the gate electrode 243 is formed on the gate insulation layer 242, phosphorus ion of high concentration is introduced to areas other than an area under the gate electrode 243 of the semiconductor layer 241 through the insulation layer 242 to form a source area and a drain area self-conformity manner. In this regard, it is to be noted that the area under the gate electrode 243 of the semiconductor layers 241, in which no phosphorus ion is introduced, becomes a channel area.

<3> Next, the source electrodes 244 and the drain electrodes 245 are formed so as to be electrically connected to the driving TFTs 24.

First, the first insulation layer 25 was formed so as to cover the gate electrodes 243, and then contact holes are formed in the first insulation layer 25.

Next, the source electrodes 244 and the drain electrodes 245 are formed in the contact holes.

<4> Next, electric wirings (junction electrodes or lead electrodes) 27 are formed for electrically connecting the drain electrodes 245 and the anodes 3, respectively.

First, the second insulation layer 26 is formed on the first insulation layer 25, and then contact holes are formed in the second insulation layer 26.

Next, the electric wirings (lead electrodes) 27 are formed in the contact holes.

Next, the anodes (pixel electrode) 3 are formed on the second insulation layer 26 so as to contact the electric wirings 27.

The anodes 3 can be formed in the same manner as in forming of the gate electrodes 243.

<6> Next, the hole transport layer 4 is formed so as to cover each of the anodes 3.

At this time, roughness is formed on a predetermined area (on which the light emitting devices 1R will be formed) of the top surface (which becomes a phase boundary or an interface with the light emitting layers 5) of the hole transport layer 4 by a rough surface treatment.

The hole transport layer 4 can be formed by various processes. Examples of the processes include: gas-phase processes such as a spatter method, a vacuum evaporation coating method, a CVD method, and the like; liquid-phase processes such as a spin coating method (a pyrosol method), a casting method, a micro gravure coating method, a gravure coating method, a bar coating method, a roll coating method, a wire-bar coating method, a dip coating method, a spray coating method, a screen printing method, a flexographic printing method, an offset printing method, an ink-jet method, and the like.

In this regard, it is to be noted that these methods are suitably selected in consideration of physical characteristics and/or chemical characteristics of the constituent material of the hole transport layer 4 such as thermostability, solubility for solvents, and the like.

As for the rough surface treatment, a rubbing treatment or a solvent treatment can be preferably used. The solvent treatment is performed by solving (elutes) unnecessary parts of the top surface of the hole transport layer 4 with a solvent to remove the dissolved unnecessary parts as described below.

After the hole transport layer (solidification layer) 4 is formed, the top surface of the hole transport layer 4 can be formed into the roughness by selectively using the rubbing treatment or the solvent treatment with a mask. According to these treatment methods, it is possible to easily and reliably form the roughness having height unevenness as described above in the desired area.

In the case where these treatment methods are used as the rough surface treatment, if the hole transport layer 4 is formed of a hole transport material constituted of compounds having polymerizable groups and the roughness is then formed on the top surface of the hole transport layer 4 in accordance with the following manner, it is possible to reliably form the hole transport layer 4 having the roughness on the top surface thereof.

<I> In the Case where Rubbing Treatment is Used as Rough Surface Treatment

First, a hole transport material which contains compounds having polymerizable groups and a solvent is supplied to form a layer, and then a part of the solvent contained in the layer is removed so that the layer is dried in a certain degree. Next, after the rubbing treatment is performed on predetermined areas of the top surface of the layer, the remaining solvent is removed so that the layer is completely dried and hardened. Thereafter, the compounds are polymerized to form the hole transport layer 4 on which the roughness is formed.

<II> In the Case where Solvent Treatment is Used as Rough Surface Treatment

First, a hole transport material which contains compounds having polymerizable groups and a solvent is supplied to form a layer, and then the solvent contained in the layer is removed so that the layer is dried and hardened. Then, the compounds are polymerized to form the hole transport layer 4. Thereafter, the solvent treatment is performed on predetermined areas of the top surface of the layer, and then unnecessary components (such as unreacted parts of the compounds) are dissolved to remove them.

Examples of such a hole transport material having the polymerizable groups include materials obtained by introducing polymerizable groups having a photo polymerization property or a thermal polymerization property with respect to the compounds described above.

In this regard, examples of the polymerizable groups having such a photo polymerization property include groups having substituents such as (meth)acryloyl group, vinyl group, epoxy group and the like at the ends thereof. Further, examples of the polymerizable groups having such a thermal polymerization property include groups having substituents such as epoxy group and the like at the ends thereof.

In addition to the compounds mentioned above, as the transport material having the polymerizable groups, the compounds set forth later in detail can also be used preferably.

In the case where the compounds are polymerized by heating, the heating temperature is not limited to any specific value, but preferably in the range of about 50 to 200° C., and more preferably in the range of about 70 to 150° C.

The heating time is preferably in the range of about 5 to 90 minutes, and more preferably in the range of about 5 to 60 minutes.

In the case where the compounds are polymerized by irradiating light, examples of irradiated light include infrared ray, visible ray, ultraviolet ray, X-ray and the like. Among these rays, the ultraviolet ray is particularly preferable.

The wavelength of the ultraviolet ray to be used is preferably in the range of about 200 to 420 nm, and more preferably in the range of about 250 to 400 nm.

Further, the intensity of irradiation of the ultraviolet ray is preferably in the range of about 10 to 5000 $mW/cm^2$, and more preferably in the range of about 20 to 1000 $mW/cm^2$.

Furthermore, the irradiating time of the ultraviolet ray is preferably in the range of about 5 to 300 seconds, and more preferably in the range of about 10 to 150 seconds.

In the present embodiment, the description was made on the case where the hole transport layer 4 for all the light emitting devices 1 is formed at once, but the hole transport layer 4 may be individually formed for each of the light emitting devices 1.

In this case, examples of the method for forming the hole transport layer 4 having the roughness on the top surface thereof include: a method in which a liquid coat which contains the hole transport material and a solvent is formed, and then the liquid coat is heated at a temperature above a boil point of the solvent (or dispersion medium) contained in the liquid coat to thereby form roughness of crater shape on the top surface of the hole transport layer 4 with vaporization of the solvent; a method in which a layer constituted of the hole transport material of amorphous type is formed, and then the layer is heated to crystallize it so that roughness is formed on the top surface of the layer; an evaporation method with a mask; and the like.

In the present embodiment, the description was made on the case where the layers are laminated one by one from the side of the hole transport layer 4 in the light emitting device 1, but the light emitting device 1 may be formed by laminating the layers from the side of the electron transport layer 6. In this case, the light emitting layer 5 may be formed in the same manner as described above.

Furthermore, in the case where the roughness is formed on the interface between the light emitting layer 5 and the electron transport layer 6, the light emitting layer 5 or the electron transport layer 6 may be formed in the same manner as described above.

<7> Next, a partitioning wall portion 31 is formed on the hole transport layer 4 so as to define areas forming the red light emitting layers 5R, the green light emitting layers 5G, and the blue light emitting layers 5B.

A constituent material of the partitioning wall portion 31 is selected by taking the factors such as a heat property, a water-repellent property, an ink solvent resistance property, adhesion with a ground layer, and the like into consideration. Examples of such a material include organic materials such as acrylic-based resins, polyimide-based resins, and the like.

Such a partitioning wall portion 31 having high accuracy of dimension is formed by using the liquid phase process as described above, especially an inkjet method.

The partitioning wall portion 31 exhibiting a water-repellent property can be obtained by using fluorine-based resins, subjecting the partitioning wall portion 31 to a fluorine-plasma treatment in the surface of the partitioning wall portion 31, and the like.

Further, shape of openings of the partitioning wall portion 31 may be of any shapes such as square (quadrangle) as shown in FIG. 2, circular, elliptic, hexagon, and the like.

In the case where the shape of the openings of the partitioning wall portion 31 is polygonal shapes, it is preferred that corner portions are formed to have roundness.

This makes it possible to reliably supply the liquid materials to the corners of the inside space of each partitioning wall portion 31 when forming the light emitting layers 5 using liquid materials.

The height of such partitioning wall portion 31 is not particularly limited, but it is adequately set according to the thickness of the light emitting layers 5.

<8> Next, the red light emitting layers 5R, the green light emitting layers 5G, and the blue light emitting layers 5B are formed on the hole transport layer 4, respectively.

The light emitting layers 5 can be formed by the gas phase process or the liquid phase process as described above. Among the processes mentioned above, the light emitting layers 5 are preferably formed with the liquid phase process using an inkjet method (droplet ejection method).

Use of the inkjet method helps to thin the thickness of the light emitting layers 5. Further, since the liquid materials used for the light emitting layers can be selectively supplied to each of the spaces defined by the partitioning wall portion 31, it is possible to prevent the liquid materials from being wasted.

In particular, the liquid materials used for the light emitting layers 5 are supplied to each of the hole transport layers 4 from a head of an inkjet print apparatus, and then solvent or dispersion medium contained in the liquid materials are removed.

Examples of a method for removing the solvent or dispersion medium include: a method leaving the liquid materials in a reduced-pressure atmosphere; a method using a heat treatment (e.g. about 50 to 60° C.); a method flowing inert gases such as nitrogen gas; and the like. The solvent remained in the liquid materials is removed by an additional heat treatment (for a short period of time at about 150° C.).

The liquid materials to be used are prepared by solving or dispersing the light emitting material described above to a solvent or a dispersion medium.

Examples of the solvent or the dispersion medium used for preparing the liquid materials include: various inorganic solvents such as nitric acid, sulfuric acid, ammonia, hydrogen peroxide, water, carbon disulfide, carbon tetrachloride, and ethylene carbonate; and various organic solvents such as ketone-based solvents e.g., methyl ethyl ketone (MEK), acetone, diethyl ketone, methyl isobutyl ketone (MIBK), methyl isopropyl ketone (MIPK), and cyclohexanone, alcohol-based solvents e.g., methanol, ethanol, isopropanol, ethylene glycol, diethylene glycol (DEG), and glycerol, ether-based solvents e.g., diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (Carbitol), cellosolve-based solvents e.g., methyl cellosolve, ethyl cellosolve, and phenyl cellosolve, aliphatic hydrocarbon-based solvents e.g, hexane, pentane, heptane, and cyclohexane, aromatic hydrocarbon-based solvents e.g., toluene, xylene, and benzene, aromatic heterocyclic compound-based solvents e.g., pyridine, pyrazine, furan, pyrrole, thiophene, and methylpyrrolidone, amide-based solvents e.g., N,N-dimethylformamide (DMF) and N,N-dimethylacetamide (DMA), halogen compound-based solvents e.g., dichloromethane, chloroform, and 1,2-dichloroethane, ester-based solvents e.g., ethyl acetate, methyl acetate, and ethyl formate, sulfur compound-based solvents e.g., dimethyl sulfoxide (DMSO) and sulfolane, nitrile-based solvents e.g., acetonitrile, propionitrile, and acrylonitrile, organic acid-based solvents e.g., formic acid, acetic acid, trichloroacetic acid, and trifluoroacetic acid, and mixed solvents containing them.

Further, the liquid materials supplied on the hole transport layer 4 have high fluidity (low viscosity) and tend to spread in a horizontal direction (surface direction) thereof. However, since the supplied liquid materials are surrounded by the partitioning wall portion 31, it is impossible to prevent the liquid materials from spreading to an area other than a predetermined area. As a result, a contour shape of each of the light emitting layers 5 (light emitting devices 1) is defined accurately.

<9> Next, the electron transport layer 6 is formed so as to cover the light emitting layers 5 and the partitioning wall portion 31.

The electron transport layer 6 can also be formed by the gas phase process or the liquid phase process as described above.

<10> Next, the cathode 8 is formed on the electron transport layer 6.

The cathode 8 can be formed by the gas phase process and the liquid phase process as described above, or it may be formed by bonding of a conductive sheet material (metal foil).

<11> Next, all of the light emitting devices 1 is covered by a box-like seal member, and then the box-like seal member is joined to the TFT circuit board 20 with various curable resins (adhesives). This makes it possible to seal all the light emitting devices 1 with the seal member. In this way, the display apparatus 10 is manufactured.

As for such curable resins, any of thermosetting resins, photocurable resins, reactive curable resins, and anaerobic curable resins can be used.

Next, description will be made with regard to examples of compounds having polymerizable groups that can be used as the constituent material of each of the layers 4 to 6.

Examples of such compounds include compounds represented by the following general formula (A1) or the following general formula (A2). Among the compounds, the compounds having hole transport ability, light emitting ability, and electron transport ability are selected as the constituent material of each of the layers 4 to 6.

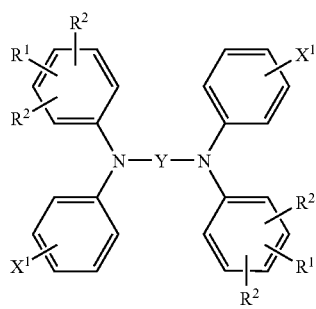

(A1)

wherein two $R^1$s are the same or different and each independently represents a straight-chain alkyl group having 2 to 8 carbon atoms, and four $R^2$S are the same or different and each independently represents a hydrogen atom, a methyl group or an ethyl group, Y represents a group containing at least one substituted or unsubstituted aromatic hydrocarbon ring or substituted or unsubstituted heterocycle, and two $X^1$s are the same kind of substituent represented by any one of the following general formulas (B1) to (B3), in which the number of carbon atoms of the two $X^1$s are the same as or different from to each other; or

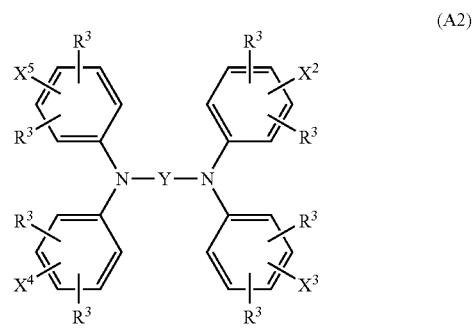

(A2)

wherein eight Rs are the same or different and each independently represents a hydrogen atom, a methyl group, or an ethyl group, Y represents a group containing at least one substituted or unsubstituted aromatic hydrocarbon ring or substituted or unsubstituted heterocycle, and $X^2$, $X^3$, $X^4$ and $X^5$ are the same kind of substituent which is represented by any one of the following general formulas (B1) to (B3), in which the number of carbon atoms of $X^2$, $X^3$, $X^4$ and $X^5$ are the same as or different from to each other.

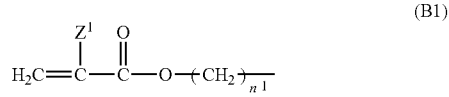

(B1)

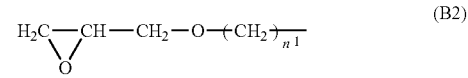

(B2)

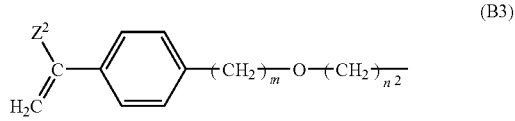

(B3)

wherein $n^1$ is an integer of 2 to 8, $n^2$ is an integer of 3 to 8, m is an integer of 0 to 3, $Z^1$ represents a hydrogen atom or a methyl group, and $Z^2$ represents a hydrogen atom, a methyl group or an ethyl group.

In this regard, it is to be noted that the term "polymerizable group X" represents a substituent $X^1$ in the compound represented by each of the above general formula (A1) (hereinafter, simply referred to as "compound (A1)"), and the term "polymerizable groups X" represents each of the substituent $X^2$, the substituent $X^3$, the substituent $X^4$, and the substituent $X^5$ in the compound represented by the above general formula (A2) (hereinafter, simply referred to as "compound (A2)") (hereinbelow, they will be collectively referred to as the substituents $X^2$ to $X^5$ on occasions).

Although each of these compounds (A1) and (A2) can exhibit excellent carrier transport ability even in the state that the compound is not polymerized at its polymerizable groups, a polymer obtained by polymerizing each compound at its polymerizable groups X can exhibit more excellent carrier transport ability.

Accordingly, by using polymers obtained by a polymerization reaction of the compound (A1) or the compound (A2) as main constituent materials of the layers 4 to 6 each of these layers 4 to 6 can exhibit more excellent characteristics (carrier transport ability, luminous characteristic, and the like).

Hereinbelow, a description will be made with regard to the features of these polymers.

Each of the polymers is obtained by a polymerization reaction of the compound (A1) or the compound (A2) (which is a diphenylamine derivative) through its polymerizable groups X, that is, a polymer in which adjacent main skeletons (diphenylamine skeleton) are linked via a chemical structure formed by the reaction between the polymerizable groups thereof (hereinafter, this chemical structure is collectively called as "link structure").

First, a description will be made with regard to a polymer obtained from the compound (A1).

In a polymer obtained by a polymerization reaction of the compounds (A1) at their substituents $X^1$ (that is, a substituent $X^1$ of a compound (A1) and a substituent $X^1$ of a compound (A1)), the polymer has a structure in which the main skeletons of the compounds are repeatedly linked via the link structure, that is, a structure in which the main skeletons repeatedly exist at a predetermined interval. Therefore, the interaction between the adjacent main skeletons decreases.

Further, each main skeleton has a conjugated chemical structure, and a unique spread of the electron cloud thereof contributes to smooth transportation of carriers (holes or electrons) in the polymer.

For this reason, the polymer exhibits high carrier transport ability. Therefore, each of layers 4 to 6 obtained by using such a polymer as its main material also has high characteristics.

In this regard, it is to be noted that if the interval between the main skeletons in the polymer is too small, interaction between the adjacent main skeletons tends to be strong. On the other hand, if the interval between the main skeletons in the polymer is too large, it becomes difficult to transfer carriers between the main skeletons, causing the carrier transport ability of the polymer to be impaired.

Therefore, it is preferred that the structure of the substituent $X^1$ is determined from these viewpoints. Specifically, in the case where a substituent represented by the above general formula (B1) or (B2) is selected as the substituent $X^1$, it is preferred that the substituent $X^1$ has a straight-chain carbon to carbon link in which $n^1$ is 2 to 8, in particular 3 to 6.

Further, in the case where a substituent represented by the above general formula (B3) is selected as the substituent $X^1$, it is preferred that the substituent $X^1$ has a straight-chain carbon to carbon link in which $n^2$ is 3 to 8 and m is 0 to 3, in particular $n^2$ is 4 to 6 and m is 1 or 2.

By satisfying the above relation, it becomes possible for the adjacent main skeletons to exist at a suitable interval, thereby decreasing the interaction between the adjacent main skeletons in the polymer reliably. In addition, it is also possible to transfer carriers between the main skeletons more reliably so that the polymer can also have high carrier transport ability.

In this connection, in the case where a substituent represented by the above general formula (B1) or (B2) is selected as the substituent $X^1$, each substituent $X^1$ has a (meth)acryloyl group or an epoxy group at its end. Since each of the (meth)acryloyl group and the epoxy group has high reactivity and bonding stability, a polymerization reaction occurs through the substituents $X^1$ relatively easily to thereby form a polymer having a long chain length.

Further, the link structure obtained by a polymerization reaction of the (meth)acryloyl groups has two double bonds (π bonds) each existing between an oxygen atom and a carbon atom. Therefore, even in the case where the interval between the main skeletons becomes relatively long, transfer of carriers between the main skeletons can be carried out reliably through the two π bonds (that is, conjugated bonds).

Furthermore, since a straight-chain carbon to carbon link (i.e., an alkylene group) exists between each of the two π bonds and each main skeleton, it is possible to prevent or suppress the interaction between the main skeletons from being enhanced.

Moreover, in the link structure obtained by a polymerization reaction of the epoxy groups, an ether link (bond) and straight-chain carbon to carbon links (i.e., alkylene groups) exist. In such a link structure having the above structure, transfer of electrons is suppressed. Therefore, even in the case where the interval between the adjacent main skeletons is relatively small, it is possible to prevent or suppress the interaction between the main skeletons from being enhanced.

In this connection, it is to be noted that if the link structure has a structure having many conjugated π bonds such as a benzene ring, interaction occurs between the adjacent main skeletons through such a structure, which cancels the effect obtained by allowing the adjacent main skeletons to exist at a suitable interval.

In this regard, however, in the case where a substituent represented by the general formula (B3) is selected as the substituent $X^1$, the substituent $X^1$ has a styrene derivative group formed by introducing a substituent $Z^2$ to a styrene group as its functional group at one end thereof. Therefore, benzene rings exist in the link structure.

As a result, in the case where each of the benzene rings and each of the main skeletons having a conjugated chemical structure are too close to each other, that is, in the case where the benzene ring is linked to the main skeleton via an ether bond or in the case where the total of $n^2$ and m is two, interaction occurs between the adjacent main skeletons through the benzene rings.

However, in this polymer, the linkage between the main skeleton and the benzene ring is formed by $n^2$ and m the total of which is three or more, that is, three or more methylene groups and an ether bond exist therebetween. This makes it possible to maintain the interval between the main skeleton and the benzene ring at a suitable condition. With this result, it is possible to prevent or suppress interaction from occurring between the adjacent main skeletons appropriately.

Further, the substituent $Z^2$ is a hydrogen atom, a methyl group or an ethyl group, wherein the substituent $Z^2$ is selected in accordance with the total of $n^2$ and m, that is, the total number of methylene groups.

For example, in the case where the total number is small, a methyl group or an ethyl group is selected as the substituent $Z^2$. Since a methyl group and an ethyl group are an electron-releasing substituent, it is possible to bias electrons to the side of the main skeleton by selecting a methyl group or an ethyl group as the substituent $Z^2$. With this result, it is possible to prevent appropriately interaction from occurring between the adjacent main skeletons which are existed through the benzene rings.

Because of the reasons stated in the above, it is preferred that the two substituents $X^1$ have substantially the same number of carbon atoms, and more preferably exactly the same number of carbon atoms. In such a case, the interval between the adjacent main skeletons can be made substantially constant. Therefore, it is possible to prevent uneven distribution of the electron density from occurring in the polymer, thereby enabling carrier transport ability of the polymer to be improved.

Furthermore, it is to be noted that the substituent $X^1$ may be bonded to the 2-, 3-, 4-, 5- or 6-position of the benzene ring, but preferably bonded to the 3-, 4- or 5-position. This makes it possible to conspicuously exhibit the effect obtained by linking the adjacent main skeletons via the substituents $X^1$. Namely, it is possible for the adjacent main skeletons to exist at a suitable interval more reliably.

The substituent $R^1$ has a straight-chain alkyl group having 2 to 8 carbon atoms, preferably 3 to 6 carbon atoms. This makes it possible for adjacent polymers to exist at a suitable interval since the adjacent polymers are prevented from closely approaching to each other by steric hindrance of the substituents $R^1$.

As a result, it becomes possible to reliably decrease the interaction between the adjacent main skeletons of different polymers in the hole transport layer 4 and the light emitting layer 5 to be formed, thereby enabling each of the layers 4 to 6 to have high carrier transport ability.

Preferably, the two substituents $R^1$ contain substantially the same number of carbon atoms, more preferably the same number of carbon atoms. This makes it possible for the adjacent polymers to exist at an interval of a certain distance in each of the layers 4 to 6. As a result, the density of polymers in each of the layers 4 to 6 becomes uniform.

Further, the substituent $R^1$ may be bonded to any of the 2- to 6-position of a benzene ring, but preferably it is bonded to the 4-position. This makes it possible to exhibit the effect of introduction of the substituents $R^1$ more conspicuously. Namely, it is possible to reliably prevent the adjacent polymers from closely approaching to each other.

Furthermore, as described above, the substituent $R^2$ is a hydrogen atom, a methyl group, or an ethyl group, and the substituent $R^2$ is selected in accordance with the number of carbon in the substituent $R^1$. Specifically, when the number of carbon in the substituent $R^1$ is large, a hydrogen atom is selected as the substituent $R^2$, while when the number of carbon in the substituent $R^1$ is small, a methyl group or an ethyl group is selected as the substituent $R^2$.

In the compound (A1), it is possible to change the carrier transport properties of the polymer to be formed by appropriately setting the chemical structure of a group (or a linking group) Y.

This is considered to result from the phenomenon that the energy level of the valence and conduction bands or the size of the band gap in the polymer is changed according to changes in the spread of the electron cloud (i.e., distribution of electrons) in the main skeleton which contributes to carrier transportation.

In the compound (A1), the group Y contains at least one substituted or unsubstituted aromatic hydrocarbon ring or at least one substituted or unsubstituted heterocyclic ring. By selecting the kinds of the aromatic hydrocarbon ring and/or heterocyclic ring appropriately, it is possible to adjust carrier transport properties in a resultant polymer relatively easily.

For example, by selecting a structure constituted from a substituted or an unsubstituted aromatic hydrocarbon ring as the group Y, it is possible to obtain a polymer which can exhibit hole transport ability, and therefore the compound (A) having such the group Y can be used as the hole transport material described above.

In more details, as for the structure constituted from the unsubstituted aromatic hydrocarbon ring, those represented by the following chemical formulas (C1) to (C17) can be mentioned.

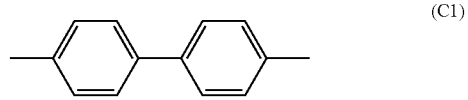
(C1)

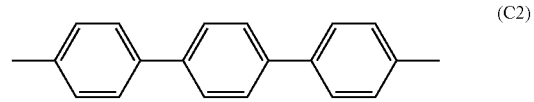
(C2)

(C3)

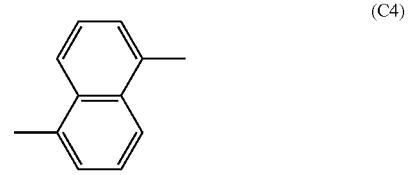
(C4)

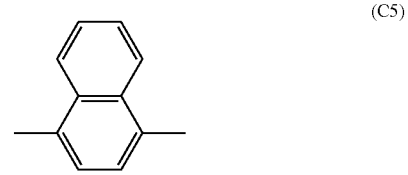
(C5)

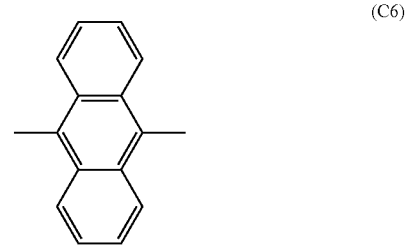
(C6)

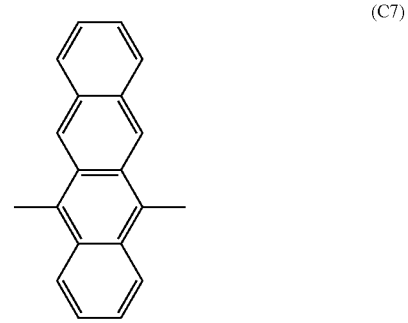
(C7)

(C8) 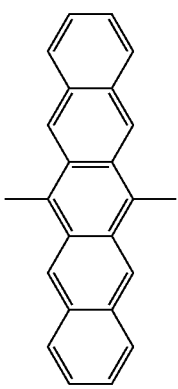

(C9) 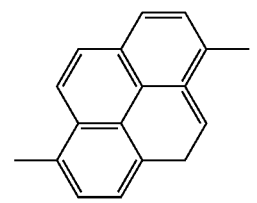

(C10) 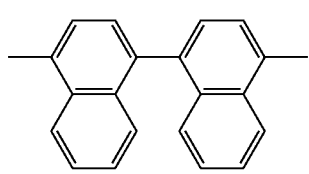

(C11) 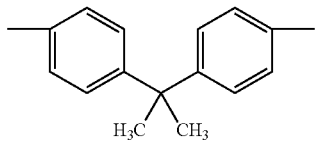

(C12) 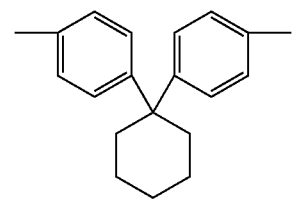

(C13) 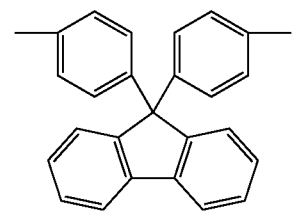

(C14) 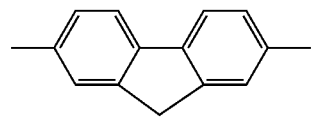

(C15) 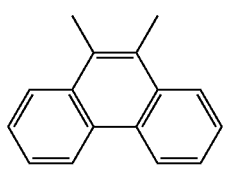

(C16) 

(C17) 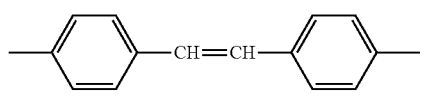

In this case, it is preferred that the group Y has 6 to 30 carbon atoms, more preferably 10 to 25 carbon atoms, and even more preferably 10 to 20, in total.

Further, in the group Y, it is preferred that the number of aromatic hydrocarbon ring is 1 to 5, more preferably 2 to 5, and even more preferably 2 or 3.

Taking the above-mentioned factors into account, in the compound (A1) a biphenylene group represented by the chemical formula (C1) or its derivative is considered to be an especially preferable structure as the group Y.

By selecting such a group, the hole transport ability in the resultant polymer becomes greatly excellent, and thus the hole transport layer 4 to be formed from the polymer can also have a higher hole transport ability.

Next, by selecting a structure which contains at least one substituted or unsubstituted heterocyclic ring as the group Y, it is possible to control the carrier transport property of the resultant polymer relatively easily.

As for such a heterocyclic ring, it is preferred to select a heterocyclic ring which contains at least one heteroatom selected from among nitrogen, oxygen, sulfur, selenium, and tellurium. By selecting such a heterocyclic ring that contains such a kind of heteroatom, it is particularly easy to change the energy level of the valence and conduction bands or the size of the band gap of the polymer.

The heterocyclic ring may be either an aromatic heterocycle or a nonaromatic heterocycle, but an aromatic heterocycle is preferably used. By using an aromatic heterocycle, it is possible to properly prevent the electron density of the main skeleton having a conjugated chemical structure from being biased, that is, it is possible to properly prevent the localization of π electrons. As a result, the carrier transport ability of the polymer is prevented from being lowered.

The group Y preferably contains 1 to 5 heterocyclic rings, more preferably 1 to 3 heterocyclic rings. In the case where the group Y contains 2 or more heterocyclic rings, these rings are the same or different. By allowing the group Y to have such a number of heterocyclic rings, it is possible to sufficiently change the energy level of the valence and conduction bands or the size of the band gap of the polymer.

The group Y preferably has 2 to 75 carbon atoms, more preferably 2 to 50 carbon atoms, in total. If the group Y has too many carbon atoms in total, the solubility of the compound represented by the general formula (A1) in a solvent tends to be lowered depending on the kind of substituent $X^1$.

By setting a total number of carbon atoms contained in the group Y to a value within the above range, it is possible to maintain the planarity of the main skeleton. As a result, the carrier transport ability of the polymer is reliably prevented from being impaired.

Taking these factors into account, as a structure constituted from unsubstituted heterocyclic rings, such structures as represented by any one of the following chemical formulas (D1) to (D17) are considered to be preferable structures.

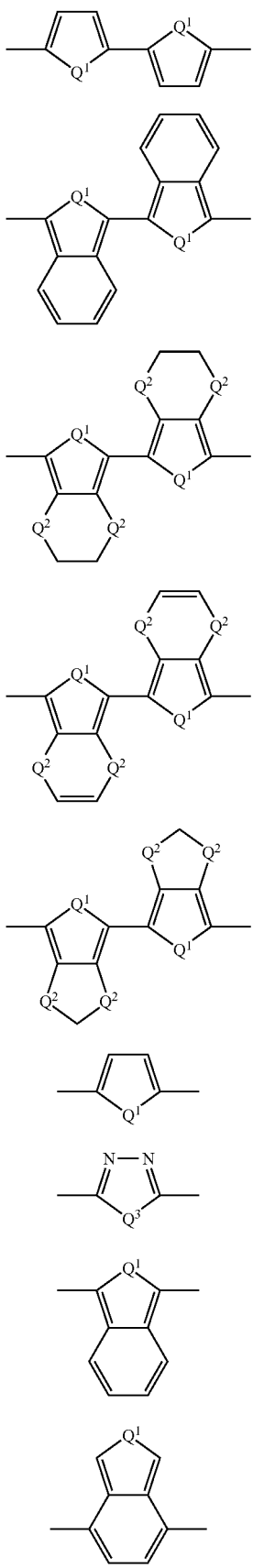

(D1)
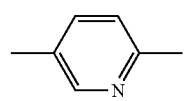

(D2)
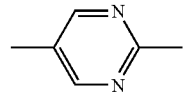

(D3)
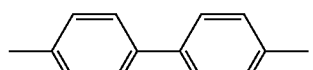

(D4)
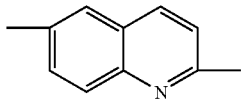

(D5)
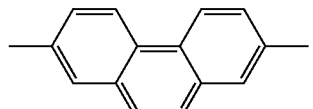

(D6)
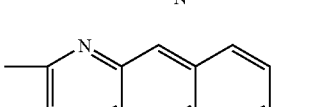

(D7)

(D8)
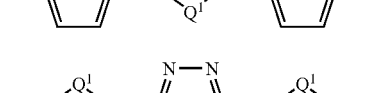

wherein in these chemical formulas $Q^1$s are the same or different and each independently represents $N-T^1$, S, O, Se, or Te (where $T^1$ represents H, $CH_3$, or Ph), $Q^2$s are the same or different and each independently represents S or O, and $Q^3$s are the same or different and each independently represents $N-T^3$, S, O, Se, or Te (where $T^3$ represents H, $CH_3$, $C_2H_5$ or Ph).

Furthermore, by selecting chemical structures constituted from substituted or unsubstituted aromatic hydrocarbon ring and substituted or unsubstituted heterocyclic ring as the group (bonding group) Y, the synergistic effect resulted from the respective effects described above can be obtained.

In this regard, it is particularly preferred that such a group Y contains aromatic hydrocarbon rings respectively bonded to each of Ns in the compound (A) and a heterocyclic ring existed between the aromatic hydrocarbon rings. This makes it possible to reliably prevent electron density from being biased in a resultant polymer. As a result, carrier transport ability of the polymer can be made constant.

Taking these factors into account, as a structure constituted from the unsubstituted aromatic hydrocarbon rings and the unsubstituted heterocyclic rings, such structures as represented by any one of the following chemical formulas (E1) to (E3) are considered to be preferable structures.

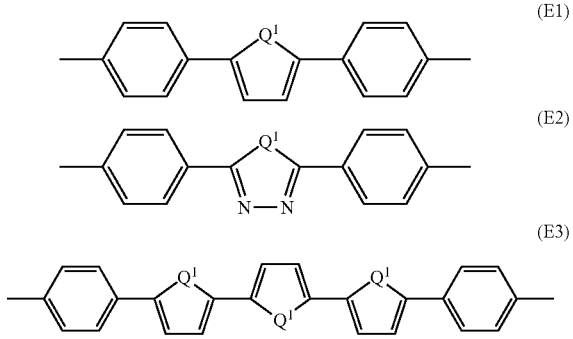

wherein in these chemical formulas Q's are the same or different and each independently represents N-$T^1$, S, O, Se, or Te (where $T^1$ represents H, $CH_3$, or Ph).

By appropriately determining the chemical structure of the group Y as described above, a polymer obtained by selecting any one of the chemical formulas (D2), (D16), (E1) and (E3) as the group Y can exhibit high hole transport ability as compared to a polymer obtained by selecting the chemical formula (D17) and can exhibit especially high hole transport ability as compared to a polymer obtained by selecting the chemical formula (D8) or (E2).

On the contrary, a polymer obtained by selecting any one of the chemical formulas (D8), (D17) and (E2) as the group Y can exhibit high electron transport ability as compared to a polymer obtained by the chemical formula (D2) or (D16). Further, a polymer obtained by selecting any one of the chemical formulas (D8), (D17) and (E2) as the group Y can also exhibit especially high electron transport ability as compared to a polymer obtained by selecting the chemical formula (E1) or (E3).

For the reasons stated in the above, in the case where a polymer obtained by selecting the structure represented by the chemical formula (D2), (D16), (E1) or (E3) as the group Y is used for the hole transport material, a polymer obtained by selecting the chemical formula (E2), (D8) and (D17) as the group Y can be used for the electron transport material.

In this regard, it is to be noted that depending on the combination of the hole transport material and the electron transport material, the polymer mentioned above can be used as the light emitting material.

For example, in the case where poly(thiophene/styrenesulfonic acid) such as poly(3,4-ethylenedioxythiophene/styrenesulfonic acid) or an arylamine compound such as N,N'-bis(1-naphthyl)-N,N'-diphenyl-benzidine(α-NPD) is used as a constituent material of the hole transport layer and a triazole-based compound such as 3,4,5-triphenyl-1,2,4-triazole or an oxadiazole compound such as 2-(4-t-butylphenyl)-5-(biphenyl-4-yl)-1,3,5-oxadiazole (PBD) is used as a constituent material of the electron transport layer, a polymer of the compound represented by the general formula (A1) in which the group Y has a chemical structure represented by the chemical formula (D12) or (D14) can be used as a constituent material for forming a light emitting layer.

Further, the unsubstituted heterocyclic ring and/or the unsubstituted aromatic hydrocarbon ring contained in the group Y may introduce a substituent so long as the planarity of the main skeleton is not greatly affected. Examples of such a substituent include an alkyl group having a relatively small number of carbon atoms such as a methyl group or an ethyl group and a halogen group and the like.

Hereinbelow, a description will be made with regard to a polymer obtained from the compound (A2).

In this regard, it should be noted that the following description will be made by focusing the different points from the polymer obtained from the compound (A1), and explanations for the same or similar points are omitted.

The compound (A2) is the same as the compound (A1) excepting that the compound (A1) has two substituents $X^1$, two substituents $R^1$, and four substituents $R^2$ while the compound (A2) has four substituents $X^2$ to $X^5$ and eight substituents $R^3$.

As for each of the substituents $X^2$ to $X^5$, a group having the same structure as that of the substituent $X^1$ is selected. In the compound (A2), since there are four substituents $X^2$ to $X^5$, a two-dimensional network is easily to be formed.

In the compound (A2), it is preferred that the substituent $X^2$ and the substituent $X^4$ are identical with each other. Namely, it is preferred that the substituent $X^2$ and the substituent $X^4$ have substantially the same number of carbon atoms and more preferably exactly the same number of carbon atoms. This makes it possible for the adjacent main skeletons of the compounds which are to be linked by the polymerization reaction between the respective substituents $X^2$ to $X^5$ (that is, the substituent $X^2$ or the substituent $X^4$) to make variation in their intervals small.

Namely, it is possible to make variation in the intervals between the main skeletons small in a resultant polymer. As a result, it is possible to prevent the electron density from being biased in the resultant polymer effectively, thereby enabling hole transport ability of the polymer to be improved.

In view of the above, it is also preferred that the substituent $X^3$ and the substituent $X^5$ are identical with each other. Namely, it is also preferred that the substituent $X^3$ and the substituent $X^5$ have substantially the same number of carbon atoms and more preferably exactly the same number of carbon atoms. This makes it possible to improve the above-described effect further, thereby enabling the carrier transport ability of the polymer to be further improved.

Further, it is also preferred that the substituent $X^2$, the substituent $X^3$, the substituent $X^4$ and the substituent $X^5$ are identical with each other. Namely, it is also preferred that the substituent $X^2$, the substituent $X^3$, the substituent $X^4$ and the substituent $X^5$ have substantially the same number of carbon atoms and more preferably exactly the same number of carbon atoms. This makes it possible to exhibit the above-described effect conspicuously.

Further, in this case, since the length of each of the substituents $X^2$ to $X^5$ which protrudes from the main skeleton is substantially the same (or exactly the same) with each other, it is possible to decrease a possibility that steric hindrance is caused by the substituents $X^2$ to $X^5$. Therefore, a polymerization reaction is made reliably between the substituents $X^2$ to $X^5$, that is, the polymer is produced reliably. With this result, it is possible to further improve the carrier transport ability of the polymer.

The substituent $R^3$ is a hydrogen atom, a methyl group, or a ethyl group, and the substituent $R^3$ can be selected according to the number of carbon atoms of the substituents $X^2$ to $X^5$. For example, in the case where the number of carbon atoms of the substituents $X^2$ to $X^5$ is large, a hydrogen atom is selected as the substituent $R^3$, while in the case where the number of carbon atoms of the substituent $R^3$ is small, a methyl group or an ethyl group is selected as the substituent $R^3$.

In the meantime, as the substituent $X^1$ and the substituents $X^2$ to $X^5$ (Hereinbelow, these substituents will be correctively referred to as "substituents X"), a chemical structure represented by the following general formula (B4) may be selected instead of the chemical structures represented by the general formulas (B1) to (B3).

In this case, in order to obtain a polymer by a polymerization reaction at the substituents X, a polycondensation reaction can be made in a state that phosgene represented by the chemical formula $COCl_2$ and/or its derivative is mediated between the substituents X to form a chemical structure represented by the following general formula (B5):

  (B4)

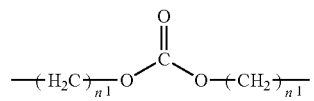  (B5)

wherein each $n^1$ in these formulas independently represents an integer of 2 to 8, and these $n^1$s are the same or different.

Such a polymer has a structure in which the main skeletons are repeatedly existed through the chemical structure represented by the general formula (B5), that is, a chemical structure in which two straight-chain carbon to carbon bonds (alkylene groups) are linked through a carbonate linkage.

Because of the existence of such a chemical structure, in the same manner as the case where each of the chemical structures represented by the general formulas (B1) to (B3) is used, it is possible to allow the main skeletons to exist at a predetermined interval, thereby enabling interaction between the adjacent main skeletons to be decreased.

There is no specific limitation on the kind of phosgene and/or its derivative to be used if it is possible to form the chemical structure represented by the above-mentioned general formula (B5) by a polycondensation reaction with the hydrokyl group at the end of each of the substituents X, but phosgene and/or its derivative which is mainly comprised of a compound represented by the following general formula (B6) is preferably used.

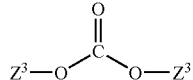  (B6)

where two $Z^3$ are the same or different, and each independently represents an alkyl group, a phenyl group, or a benzyl group each having 1 to 6 carbon atoms.

When the substituents $X^1$ are allowed to make a polycondensation reaction with phosgene and/or its derivative, a by-product material is produced. By using phosgene and/or the above-mentioned compound (B6) in the polycondensation reaction, it is possible to eliminate such a by-product material from each of the layers 4 to 6 to be formed relatively easily. In this way, it is possible to prevent carriers from being captured by the by-product material in each of the layers 4 to 6 to be formed. As a result, it is possible to prevent appropriately characteristics of each of the layers 4 to 6 from being lowered.

And now, a curing agent may be added to a polymer obtained from the compound (A1) or the compound (A2) as described above.

Namely, a polymerization reaction of the substituents X of the compound (A1) or the compound (A2) may be carried out via the curing agent.

Examples of such curing agent include acryl-based curing agents, vinyl compounds such as divinylbenzene, and epoxy-based curing agents.

In this connection, in the case where the chemical structure represented by any one of the above-mentioned general formulas (B1) to (B3) is selected as the substituent X, it is particularly effective to make the polymerization reaction of the substituents X via the curing agent.

This makes it possible to effectively prevent the interval between the main skeletons from becoming too small even in the case where a substituent having a relatively small number of carbon atoms, that is a substituent having a relatively short chain length is selected as the substituent X. As a result, since the interval between the main skeletons is maintained at a proper distance, it is possible to prevent reliably the interaction between the main skeletons from being increased.

In the case where the chemical structure represented by the above-mentioned general formula (B1) is selected as the substituent X, it is preferable to use at least one acryl-based curing agent selected from the group comprising a polyester (meth)acrylate curing agent, and epoxy(meth)acrylate curing agent, and a polyurethane(meth)acrylate curing agent and the like.

Examples of the polyester(meth)acrylate curing agent include the compounds represented by the following general formulas (F1) to (F3).

Examples of the epoxy(meth)acrylate curing agent include the compounds represented by the following general formulas (F4) to (F8).

Examples of the polyurethane (meth)acrylate curing agent include the compound represented by the following general formula (F9).

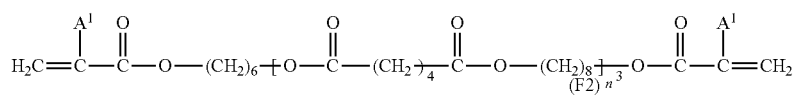  (F1)

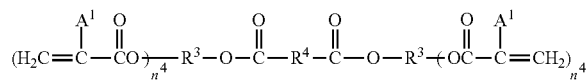  (F3)

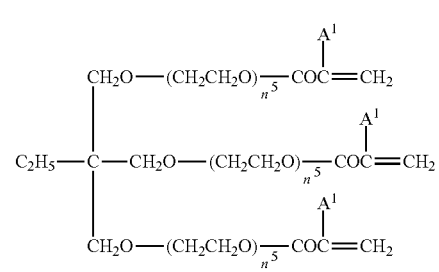

-continued

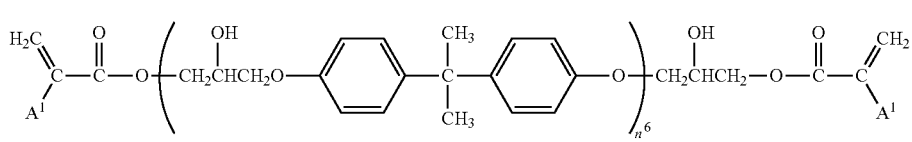
(F4)

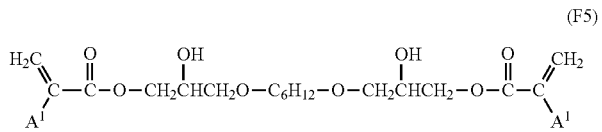
(F5)

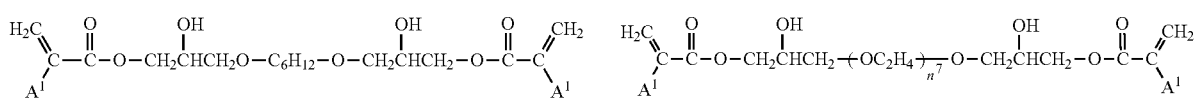
(F6)

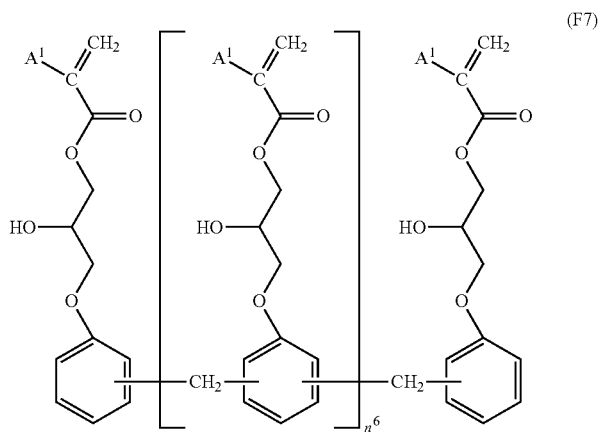
(F7)

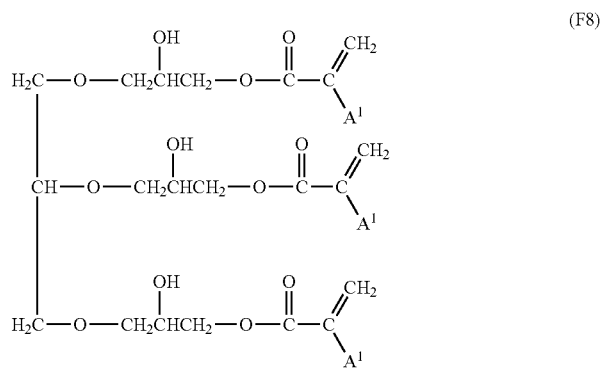
(F8)

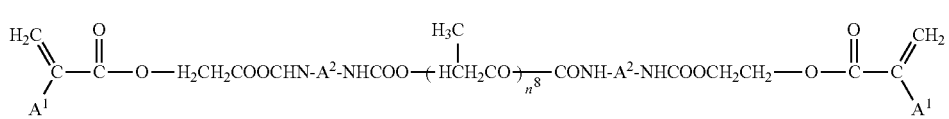
(F9)

Note that in these general formulas, $n^3$ is an integer equal to or smaller than 4,500, $n^4$ is an integer of 1 to 3, and is an integer of 0 to 1500. $n^6$s are the same or different, and each independently represents an integer of 1 to 10. $n^7$ is an integer of 1 to 40, and $n^8$ is an integer of 1 to 100. $R^3$s are the same or different, and each independently represents an alkylene group having carbon atoms of 1 to 10, and $R^4$ represents an alkylene group having carbon atoms of 1 to 100. $A^1$s are the same or different, and each independently represents a hydrogen atom or a methyl group. $A^2$s are the same or different, and each independently represents a group obtained by removing two isocyanate groups from a diisocyanate compound.

Further, in the case where the chemical structure represented by the general formula (B2) is selected, it is preferable to use at least one of the following epoxy-based curing agents as the curing agent. Namely, examples of such epoxy-based curing agents include a (meth)acrylic ester-based epoxy cross-linking agent, a bisphenol epoxy cross-linking agent, a glycidyl ester-based epoxy cross-linking agent, an alicyclic epoxy cross-linking agent, an urethane modified epoxy cross-linking agent, a silicon-containing epoxy cross-linking agent, a polyfunctional phenol-based epoxy cross-linking agent and a glycidyl amine-based epoxy cross-linking agent.

As for such the (meth)acrylic ester-based epoxy cross-linking agent, the compound represented by the following general formula (G1) can be mentioned.

As for such the bisphenol epoxy cross-linking agent, the compounds represented by the following general formulas (G2) to (G6) can be mentioned.

As for such the glycidyl ester-based epoxy cross-linking agent, the compounds represented by the following general formulas (G7) and (G8) can be mentioned.

As for such the alicyclic epoxy cross-linking agent, the compounds represented by the following general formulas (G9) to (G12) can be mentioned.

As for such the urethane modified epoxy cross-linking agent, the compounds represented by the following general formula (G13) can be mentioned.

As for such the silicon-containing epoxy cross-linking agent, the compound represented by the following general formula (G14) can be mentioned.

As for such the polyfunctional phenol-based epoxy cross-linking agent, the compounds represented by the following general formulas (G15) to (G22) can be mentioned.

As for such the glycidyl amine-based epoxy cross-linking agent, the compounds represented by the following general formulas (G23) to (G25) can be mentioned.

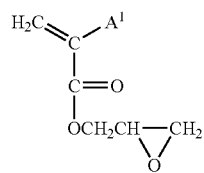
(G1)
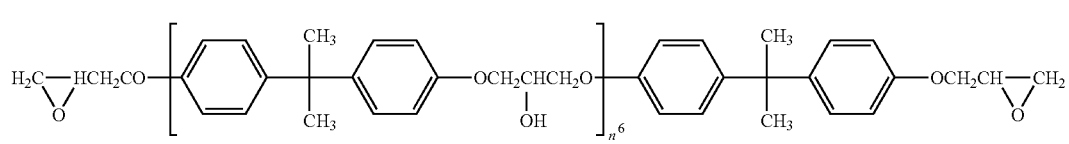
(G2)
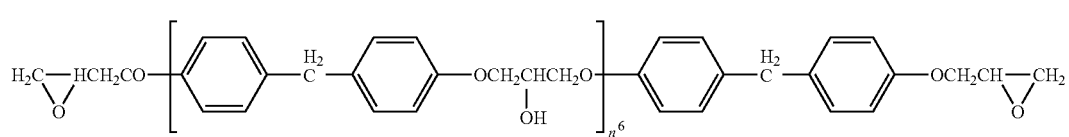
(G3)
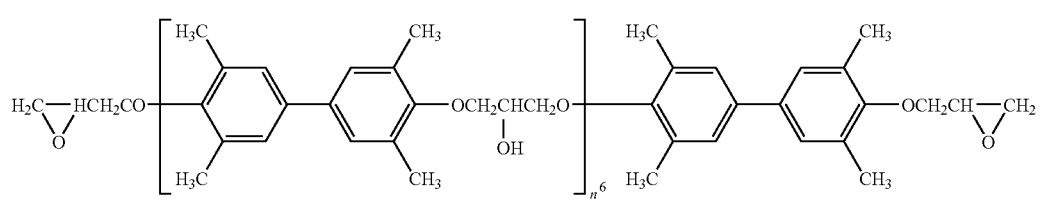
(G4)
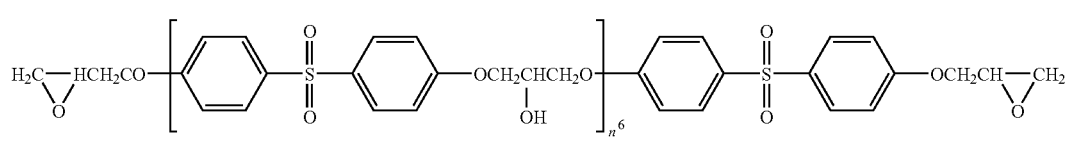
(G5)
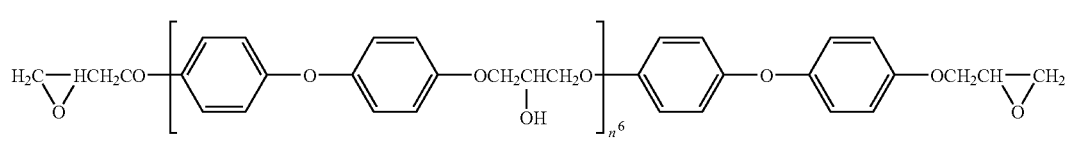
(G6)
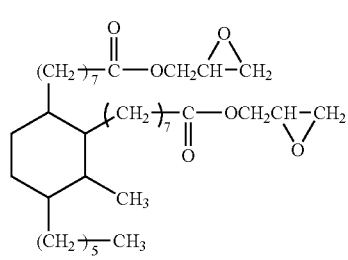
(G7)
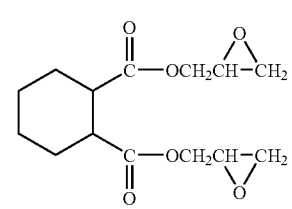
(G8)
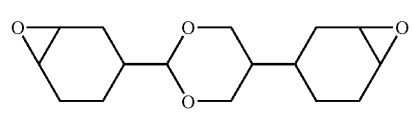
(G9)
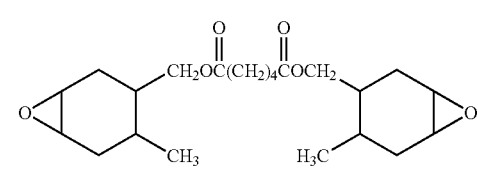
(G10)
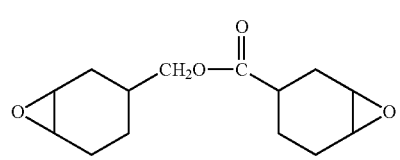
(G11)
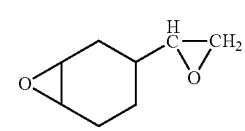
(G12)

-continued
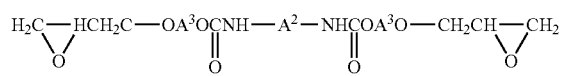 (G13)
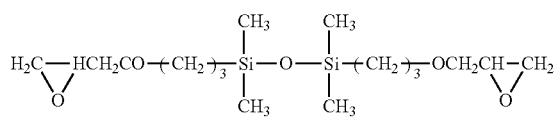 (G14)
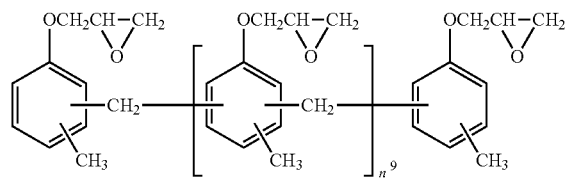 (G15)
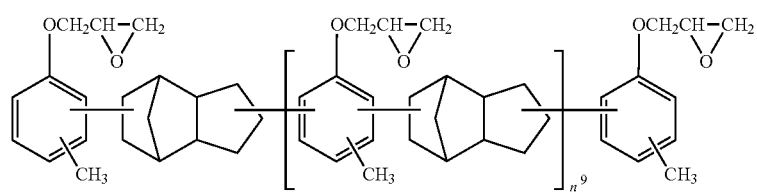 (G16)
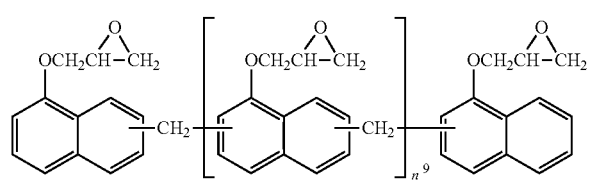 (G17)
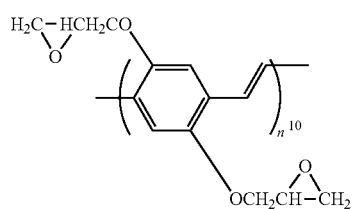 (G18)
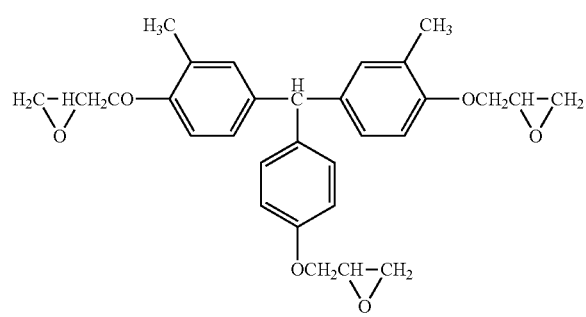 (G19)
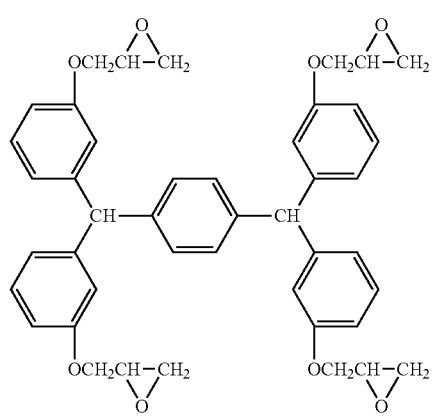 (G20)

-continued

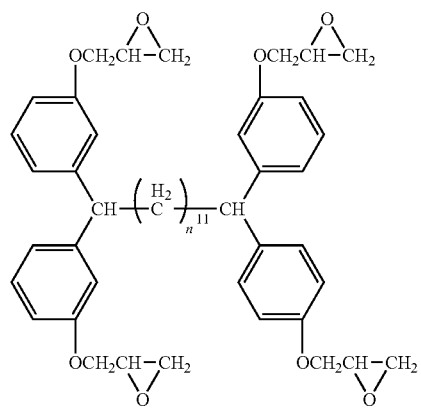
(G21)

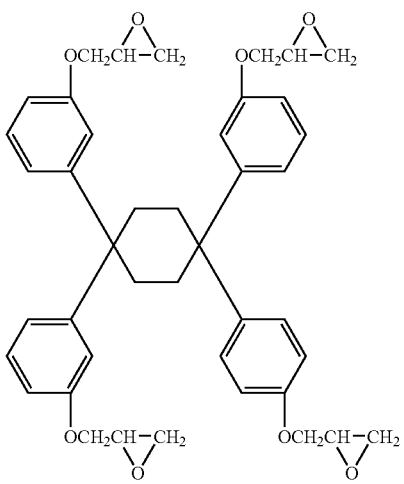
(G22)

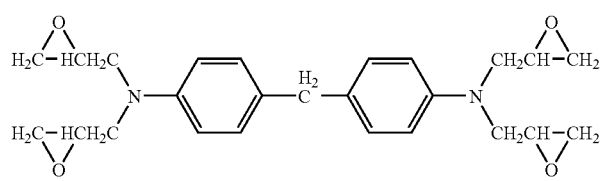
(G23)

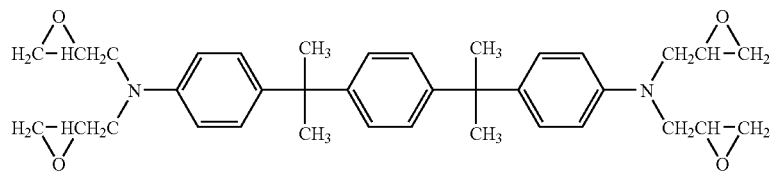
(G24)

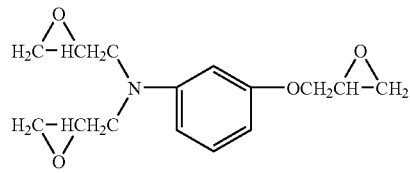
(G25)

Note that in these general formulas, $A^1$ represents a hydrogen atom or a methyl group. $n^6$s are the same or different, and each independently represents an integer of 0 to 10, and $n^9$s are the same or different, and each independently represents an integer of 1 to 20. $n^{10}$ represents an integer of 1 to 30, and $n^{11}$ is an integer of 0 to 8.

$A^2$ independently represents a group obtained by removing two isocyanate groups from a diisocyanate compound, and $A^3$s are the same or different, and each independently represents a group obtained by removing two isocyanate groups from a diisocyanate compound.

In the case where the chemical structure represented by the above-mentioned general formula (B3) is selected as the substituent X, it is preferable to use at least one vinyl compound such as polyethyleneglycoldi(meth)acrylate which is represented by the hollowing general formulas (H1) and divinylbenzene.

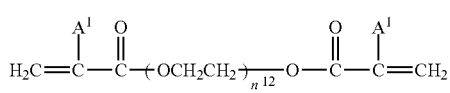
(H1)

wherein $n^{12}$ represents an integer of 5 to 15, and $A^1$s are the same or different, and each independently represents a hydrogen atom or a methyl group.

Electronic Equipment

The display apparatus 10 described above can be used for various electronic equipments.

Figure 5:
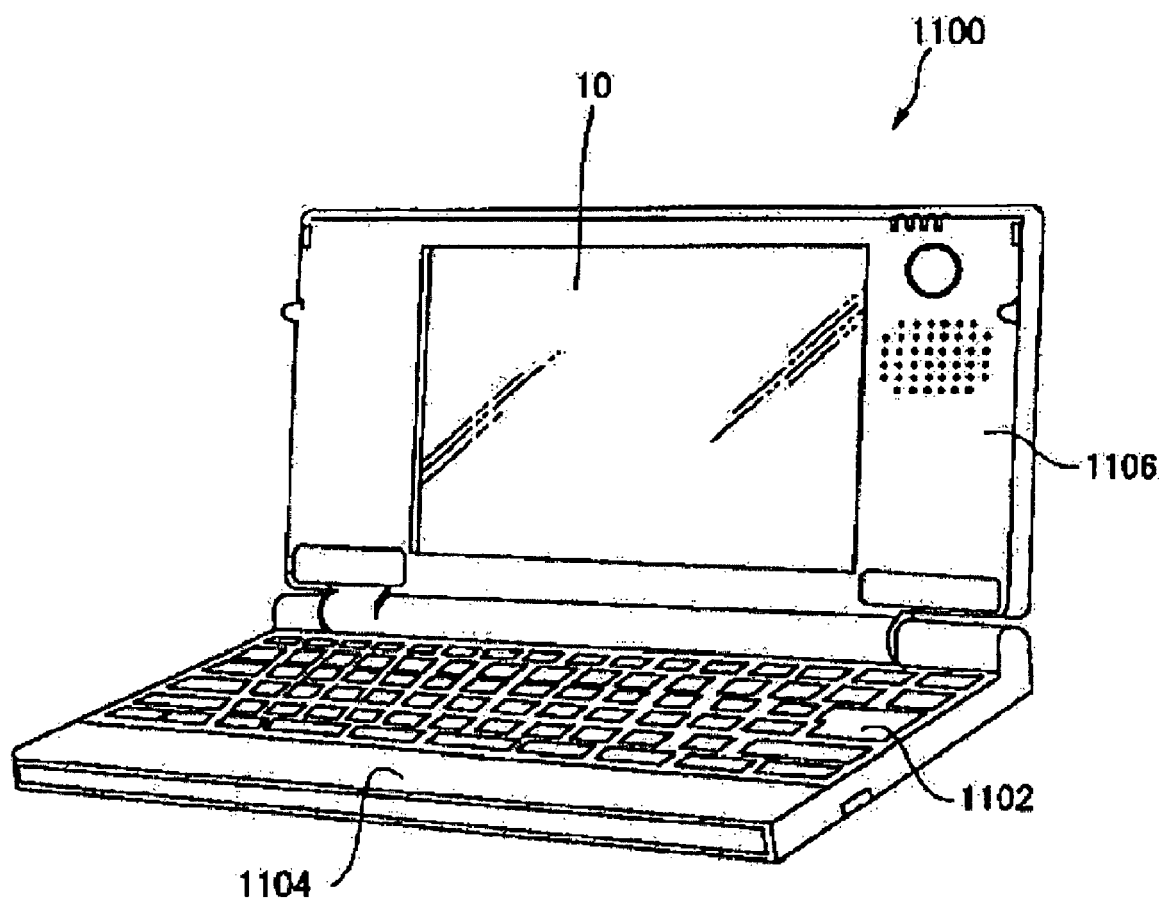
FIG. 5 is a perspective view which shows the structure of a personal mobile computer (or a personal notebook computer) which is one example of the electronic equipment according to the present invention.

FIG. 5 is a perspective view which shows the structure of a personal mobile computer (or a personal notebook computer) which is one example of the electronic equipment according to the present invention.

In FIG. 5, a personal computer 1100 is comprised of a main body 1104 provided with a keyboard 1102 and a display unit 1106 provided with a display (screen). The display unit 1106 is rotatably supported by the main body 1104 via a hinge structure.

In the personal computer 1100, the display (screen) of the display unit 1106 is constructed from the display apparatus 10 described above.

Figure 6:
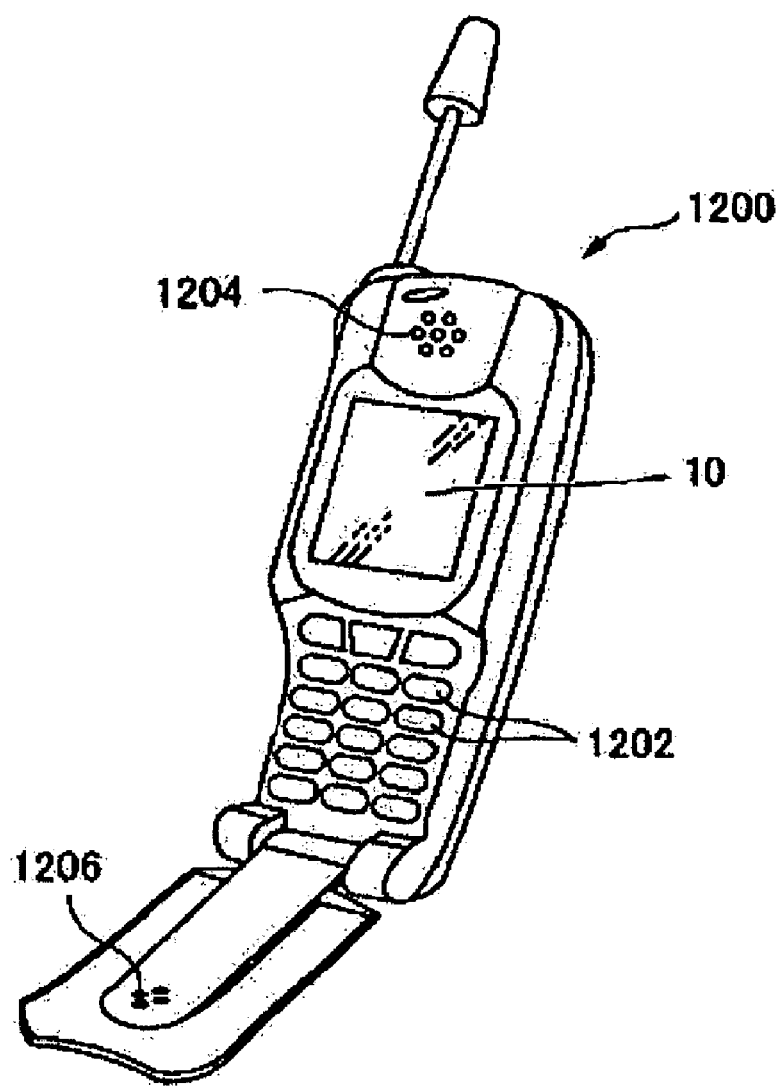
FIG. 6 is a perspective view which shows the structure of a mobile phone (including the personal handyphone system (PHS)) which is the other example of the electronic equipment according to the present invention.

FIG. 6 is a perspective view which shows the structure of a mobile phone (including the personal handyphone system (PHS)) which is the other example of the electronic equipment according to the present invention.

The mobile phone 1200 shown in FIG. 6 includes a plurality of operation buttons 1202, an earpiece 1204, a mouthpiece 1206, and a display.

In this mobile phone 1200, the display is constructed from the display apparatus 10 as described above.

Figure 7:
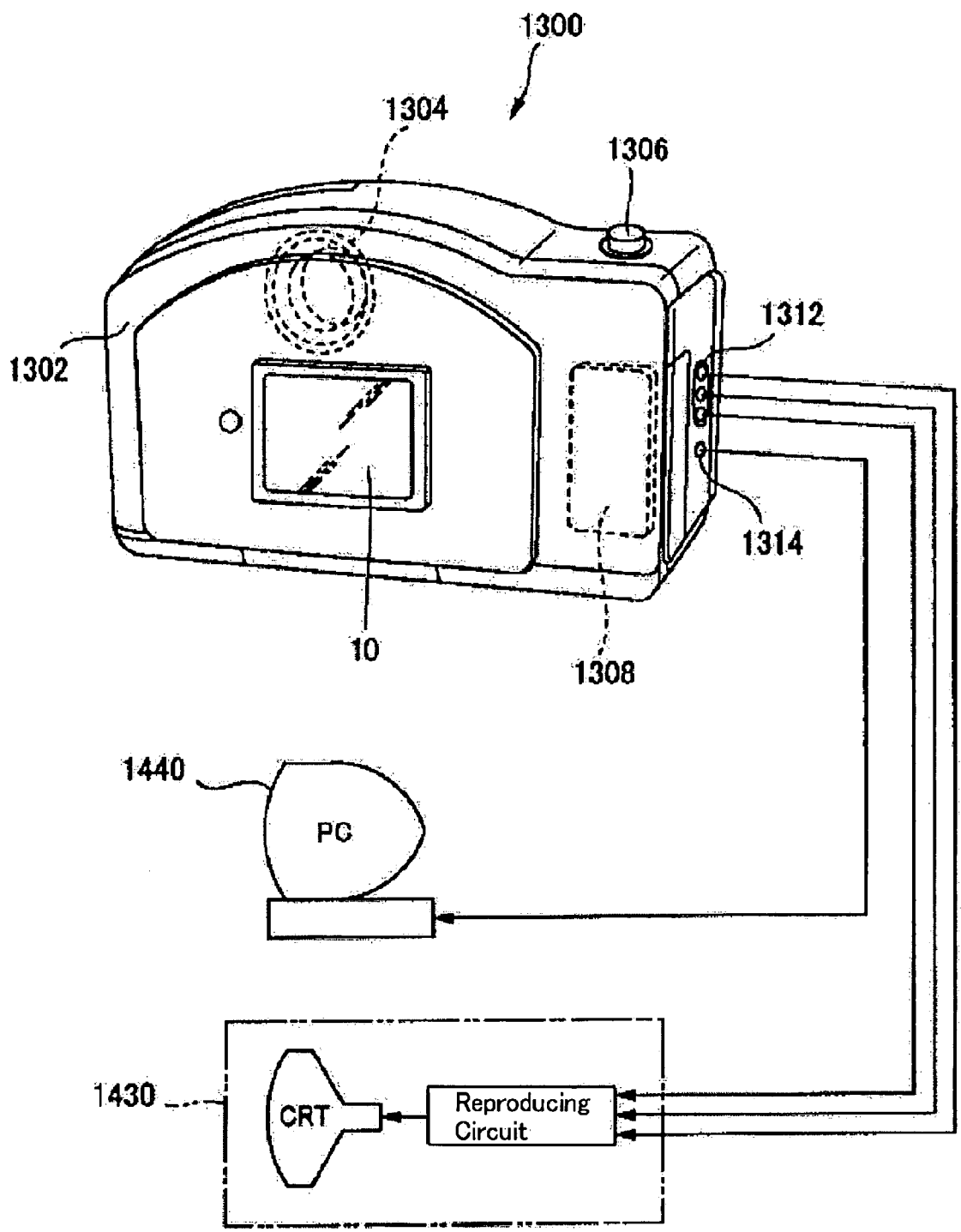
FIG. 7 is a perspective view which shows the structure of a digital still camera which is still other example of the electronic equipment according to the present invention.

FIG. 7 is a perspective view which shows the structure of a digital still camera which is still other example of the electronic equipment according to the present invention. In this drawing, interfacing to external devices is simply illustrated.

In a conventional camera, a silver salt film is exposed to the optical image of an object. On the other hand, in the digital still camera 1300, an image pickup device such as a CCD (Charge Coupled Device) generates an image pickup signal (or an image signal) by photoelectric conversion of the optical image of an object.

In the rear surface of a case (or a body) 1302 of the digital still camera 1300, there is provided a display which provides an image based on the image pickup signal generated by the CCD. That is, the display functions as a finder which displays the object as an electronic image.

In this digital still camera 1300, the display is constructed from the display apparatus 10 as described above.

In the inside of the case, there is provided a circuit board 1308. The circuit board 1308 has a memory capable of storing an image pickup signal.

In the front surface of the case 1302 (in FIG. 7, the front surface of the case 1302 is on the back side), there is provided a light receiving unit 1304 including an optical lens (an image pickup optical system) and a CCD.

When a photographer presses a shutter button 1306 after checking an object image on the display, an image pickup signal generated by the CCD at that time is transferred to the memory in the circuit board 1308 and then stored therein.

Further, in the side surface of the case 1302 of the digital still camera 1300, there are provided a video signal output terminal 1312 and an input-output terminal for data communication 1314. As shown in FIG. 7, when necessary, a television monitor 1430 and a personal computer 1440 are connected to the video signal output terminal 1312 and the input-output terminal for data communication 1314, respectively.

In this case, an image pickup signal stored in the memory of the circuit board 1308 is outputted to the television monitor 1430 or the personal computer 1440 by carrying out predetermined operations.

The electronic equipment according to the present invention can be applied not only to the personal computer (which is a personal mobile computer) shown in FIG. 5, the mobile phone shown in FIG. 6, and the digital still camera shown in FIG. 7 but also to a television set, a video camera, a view-finer or monitor type of video tape recorder, a laptop-type personal computer, a car navigation device, a pager, an electronic notepad (which may have communication facility), an electronic dictionary, an electronic calculator, a computerized game machine, a word processor, a workstation, a videophone, a security television monitor, an electronic binocular, a POS terminal, an apparatus provided with a touch panel (e.g., a cash dispenser located on a financial institute, a ticket vending machine), medical equipment (e.g., an electronic thermometer, a sphygmomanometer, a blood glucose meter, an electrocardiograph monitor, ultrasonic diagnostic equipment, an endoscope monitor), a fish detector, various measuring instruments, gages (e.g., gages for vehicles, aircraft, and boats and ships), a flight simulator, various monitors, and a projection display such as a projector.

The light emitting apparatus and the electronic equipment according to the present invention have been described based on the embodiments shown in the drawings, but the present invention is not limited thereto.

EXAMPLES

Next, the present invention will be described with reference to the actual examples.

1. Synthesis of Compound (A)

First, 1 mol of 6-(p-aminophenyl)hexanol was dissolved in 150 mL of acetic acid, and acetic anhydride was dropped therein at room temperature and then they were stirred. After the completion of the reaction, a solid matter precipitated was filtered and then dried after washing with water to obtain a dry substance.

Next, 0.37 mol of the thus obtained substance, 0.66 mol of 1-bromo-4-hexylbenzene, 1.1 mol of potassium carbonate, copper powder, and iodine were mixed, and the mixture was heated at a temperature of 200° C. After the heated mixture was cooled down, 130 mL of isoamyl alcohol, 50 mL of pure water and 0.73 mol of potassium hydroxide were added to the mixture, and it was stirred and then dried to thereby obtain a compound.

Next, 130 mmol of the thus obtained compound, 62 mmol of 4,4'-diiodobiphenyl, 1.3 mmol of palladium acetate, 5.2 mmol of t-butylphosphine, 260 mmol of sodium t-butoxide, and 700 mL of xylene were mixed, and then they were stirred at a temperature of 120° C.

Thereafter, the mixture was cooled down for crystallization.

Next, 100 mmol of the compound and 200 mmol of acryloyl chloride were added in a xylene solution, and then they were stirred with heating. Thereafter, the mixture was cooled down and crystallized to thereby obtain a compound.

Then, the thus obtained compound was confirmed to be the following compound (A) by means of a mass spectrum (MS) method, a $^1$H-nuclear magnetic resonance ($^1$H-NMR) spectrum method, a $^{13}$C-nuclear magnetic resonance ($^{13}$C-NMR) spectrum method, and a Fourier transform infrared absorption (FT-IR) spectrum method.

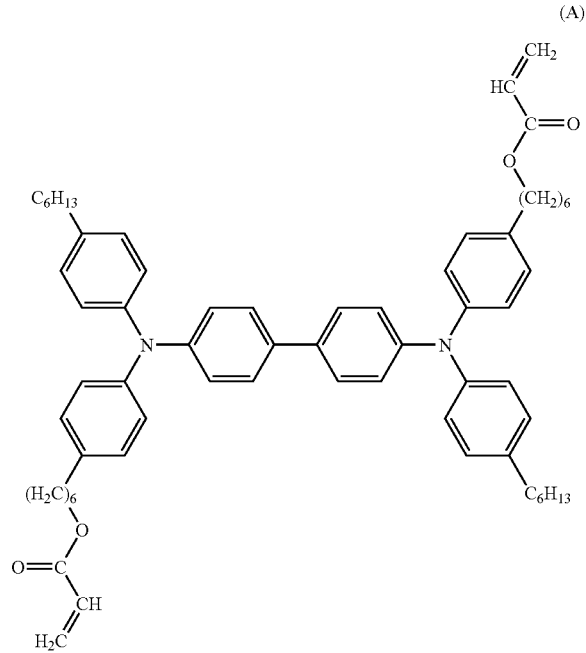

(A)

2. Manufacture of Display Apparatus

Five display apparatus were manufactured in each of the following Examples and Comparative Examples.

Example 1

1A First, a transparent glass substrate having an average thickness of 5 mm was prepared, and then a circuit section was formed on the grass substrate as described above.

2A Next, an ITO coat having an average thickness of 100 nm was formed on the circuit section by a vacuum evaporation method. Thereafter, unnecessary portions of the ITO coat were removed by a photolithography method and an etching method to obtain anodes (pixel electrodes).

3A Next, a hole transport layer was formed so as to cover the anodes.

The hole transport layer was formed as follows. First, the compound (A) and radical polymerization initiator ("IRGACURE 651" produced by NAGASE & CO., LTD.) in weight ratio of 95:5 were dissolved in a dichloroethane solution.

Next, the dichloroethane solution was applied on the circuit section so as to cover the anodes by a spin coating method, and then a part of dichloroethane (solvent) was removed.

Next, after a rubbing treatment was performed to areas which were slightly larger than predetermined areas on which red light emitting layers were to be formed through a stainless board (mask) having openings partially formed and the thickness of 0.1 mm, a solidification layer was obtained by drying the dichloroethane solution.

Thereafter, the solidification layer was irradiated with ultraviolet ray having a wavelength of 185 nm from a mercury lamp ("UM-452", USHIO Inc.) through a filter at an intensity of irradiation of 3 mW/cm$^2$ for 400 seconds in the atmosphere to cross-link the compound (A).

In this way, a hole transport layer, which had an average thickness of 50 nm and had the roughness comprised of minute convex portions in the predetermined areas of the top surface thereof, was obtained.

In this regard, the density of the convex portions formed on the top surface of the hole transport layer and the surface roughness Ra of the top surface of the hole transport layer were 1000 pieces/mm$^2$ and 8 μm, respectively.

4A Next, polyimide (insulative photosensitive resin) was supplied onto the hole transport layer so as to define a plurality of areas forming the light emitting layers, and then a partitioning wall portion was formed by exposure of the photosensitive resin.

5A Next, the materials used for forming the light emitting layers for the predetermined different colors described below were supplied to the inside of each of the areas defined by the partitioning wall portion, and then the materials were dried to obtain respective light emitting layers each having the average thickness of 50 nm.

The material used for the red light emitting layers was prepared by dissolving tris(1-phenylisoquinoline)iridium (III) in a xylene solution.

The material used for the green light emitting layers was prepared by dissolving 9,10-bis[(9-ethyl-3-carbazole)-vinylenyl]-anthracene in a xylene solution.

The material used for the blue light emitting layers was prepared by dissolving 4,4'-bis(9-ethyl-3-carbazovinylene)-1,1'-biphenyl in a xylene solution.

6A Next, an electron transport layer having an average thickness of 20 nm was formed on the respective light emitting layers and the partitioning wall portion by a vacuum evaporation method using 3,4,5-triphenyl-1,2,4-triazole.

7A Next, an AlLi electrode (that is, a cathode) having an average thickness of 300 nm was formed on the electron transport layer by a vacuum evaporation method.

8A Next, a protection cover made of polycarbonate was provided so as to cover these layers (light emitting devices) described above, and was then secured and sealed with an ultraviolet curable resin to obtain an display apparatus.

Example 2

1B First, a transparent glass substrate having an average thickness of 5 mm was prepared, and then a circuit section was formed on the grass substrate as described above.

2B Next, an ITO coat having an average thickness of 100 nm was formed on the circuit section by a vacuum evaporation method. Thereafter, unnecessary portions of the ITO coat were removed by a photolithography method and an etching method to obtain anodes (pixel electrodes).

3B Next, a hole transport layer was formed on the circuit section so as to cover the anodes.

The hole transport layer was formed as follows. First, the compound (A) and a radical polymerization initiator ("IRGACURE 651" produced by NAGASE & CO., LTD.) in weight ratio of 95:5 were dissolved in a dichloroethane solution.

Next, the dichloroethane solution was applied on the circuit section so as to cover the anodes by a spin coating method, and then a part of dichloroethane (solvent) was removed to obtain a solidification layer.

Thereafter, the solidification layer was irradiated with ultraviolet ray having a wavelength of 185 nm from a mercury lamp ("UM-452", USHIO Inc.) through a filter at an intensity of irradiation of 3 mW/cm$^2$ for 400 seconds in the atmosphere to cross-link the compound (A).

Next, a cloth which had been dipped in a xylene solution (solvent) was contacted with areas of the solidification layer which were slightly larger than respective predetermined areas of the solidification layer on which red light emitting layers were to be formed through a stainless board (mask) having openings partially formed and the thickness of 0.1 mm, so that the unreacted compound (A) was dissolved, and then the dissolved compound (A) was removed (solvent removal treatment).

In this way, a hole transport layer, which had an average thickness of 50 nm and had the roughness comprised of minute convex portions in the predetermined areas of the top surface thereof, was obtained.

In this regard, the density of the formed convex portions on the top surface of the hole transport layer and the surface roughness Ra of the top surface of the hole transport layer were 3000 pieces/mm$^2$ and 4 μm, respectively.

4B Next, polyimide (insulative photosensitive resin) was supplied onto the hole transport layer so as to define a plurality of areas forming the light emitting layers, and then a partitioning wall portion was formed by exposure of the photosensitive resin.

5B Next, the materials used for forming the light emitting layers for the predetermined different colors described below were supplied to the inside of each of the areas defined by the partitioning wall portion, and then the materials were dried to obtain respective light emitting layers each having the average thickness of 50 nm.

The material used for the red light emitting layers was prepared by dissolving poly[2,5-bis(3,7-dimethyloctyloxy)-1,4-phenylenevinylene] in a xylene solution.

The material used for the green light emitting layers was prepared by dissolving poly(9,9-dihexyl-2,7-vinylenefluorenylene) in a xylene solution.

The material used for the blue light emitting layers was prepared by dissolving poly[(9,9-dioctylfluorene-2,7-diyl)-co-(2,5-dimethoxybenzene-1,4-diyl)] in a xylene solution.

6B Next, an electron transport layer having an average thickness of 20 nm was formed on the respective light emitting layers and the partitioning wall portion by a vacuum evaporation method using 3,4,5-triphenyl-1,2,4-triazole.

7B Next, an AlLi electrode (that is, a cathode) was formed on the electron transport layer by a vacuum evaporation method so as to have an average thickness of 300 nm.

8B Next, a protection cover made of polycarbonate was provided so as to cover these layers (light emitting devices) described above, and was then secured and sealed with an ultraviolet curable resin to obtain an display apparatus.

Comparative Example 1

The display apparatus was manufactured in the same manner as in Example 1 except that the rubbing treatment was omitted.

Comparative Example 2

The display apparatus was manufactured in the same manner as in Example 2 except that the solvent treatment was omitted.

3. Evaluation

In each of the display apparatuses manufactured in the Examples and the Comparative Examples mentioned above, the light emitting devices for the respective colors were driven to emit lights, and the luminous brightness of each of the lights for the respective colors was measured.

As a result, in each of the display apparatuses manufactured in the Examples, the luminous brightness of each of the lights of the respective colors was the substantially equal to each other.

In contrast, in each of the display apparatuses manufactured in the Comparative Examples, the luminous brightness of the light of red color was obviously lower than the luminous brightness of each of the lights of green color and blue color.

In the present invention, a light emitting apparatus (display apparatus) includes a plurality of light emitting devices for emitting lights of a plurality of predetermined different colors, wherein in each of the light emitting devices an interface between a light emitting layer and a carrier transport layer thereof is formed into a roughened surface, and the roughness of the interfaces of the light emitting devices for the predetermined different colors is set so that the degree of the roughness of the light emitting devices for a predetermined color is set to be different from the degree of the roughness of the light emitting devices for each of the other different colors.

For example, in one embodiment, such roughness is formed on the interface between the light emitting layer and the carrier transport layer of each of the light emitting devices for the predetermined color, while substantially no roughness is formed on the interfaces of the light emitting devices for each of the other different colors.

With these structures, it is possible to make the luminous brightness in each of the plurality of light emitting devices for the respective colors substantially equal to each other when substantially the same voltage is applied thereto.

In other word, it is possible to make the luminous brightness of each of the light emitting devices for the respective colors substantially equal to each other with a relatively simple structure that does not need a provision of a complex controlling circuit.

Further, electronic equipment provided with such a display apparatus exhibits high reliability. Therefore, the present invention has industrial applicability.

What is claimed is:

1. A light emitting apparatus which is provided with a plurality of light emitting devices for emitting a plurality of predetermined different colors including red, green and blue, the plurality of light emitting devices having a plurality of light emitting layers consisting of predetermined different light emitting materials corresponding to the respective colors, wherein a luminous brightness of the light emitting material for the red color is the lowest among luminous brightnesses of the light emitting materials for the other colors, and the luminous brightness of the light emitting material for the green color is substantially equal to that of the light emitting material for the blue color, each of the plurality of light emitting devices comprising:

a light emitting layer; and a carrier transport layer which is provided in contact with the light emitting layer through an interface therebetween;

wherein the light emitting apparatus includes light emitting devices for the red color, wherein the interface of each of the light emitting devices for the red color is formed into a roughened surface to increase the luminous brightness of each of the light emitting devices for the red color and the interface of each of the light emitting devices for the other colors is formed into a smooth surface so that the luminous brightness of the light emitting devices for the respective colors becomes substantially equal to each other when a substantially same voltage is applied thereto.

2. The light emitting apparatus as claimed in claim 1, wherein the roughness of the interface of each of the light emitting devices for the red color is formed so as to have height unevenness.

3. The light emitting apparatus as claimed in claim 1, wherein in each of the light emitting devices for the red color, the light emitting layer has a first surface and a second surface opposite to the first surface, the carrier transport layer has a first surface which is in contact with the first surface of the light emitting layer and a second surface opposite to the first surface thereof, and both the first surfaces are formed with numbers of minute convex portions which form the roughness, wherein the density of the convex portions on the first surface of the light emitting layer or the first surface of the carrier transport layer is in the range of 70 to $1 \times 10^6$ pieces with respect to 1 mm$^2$.

4. The light emitting apparatus as claimed in claim 3, wherein the surface roughness Ra (defined by JIS B 0601) of the first surface of the light emitting layer or the first surface of the carrier transport layer is in the range of 4 to 10 μm.

5. The light emitting apparatus as claimed in claim 3, wherein the roughness of the interface is formed on the first surface of the light emitting layer or the first surface of the carrier transport layer by a rough surface treatment.

6. The light emitting apparatus as claimed in claim 5, wherein the rough surface treatment is a rubbing treatment or a solvent treatment.

7. The light emitting apparatus as claimed in claim 5, wherein the layer which has been subjected to the rough surface treatment is formed by providing compounds having polymerizable groups, and then polymerizing the compounds.

8. The light emitting apparatus as claimed in claim 7, wherein the rough surface treatment is a rubbing treatment, and the layer which has been subjected to the rough surface treatment is formed by performing the rubbing treatment to the compounds having the polymerizable groups before polymerization of the compounds.

9. The light emitting apparatus as claimed in claim 7, wherein the rough surface treatment is a solvent treatment, and the layer which has been subjected to the rough surface treatment is formed by performing the solvent treatment to the compounds having the polymerizable groups which have been already polymerized.

10. The light emitting apparatus as claimed in claim 5, wherein the rough surface treatment is selectively performed on a desired area of the first surface of the light emitting layer or the first surface of the carrier transport layer with a mask.

11. The light emitting apparatus as claimed in claim 1, wherein size of the light emitting layer in each of the plurality of the light emitting devices is substantially the same as with each other when the light emitting devices are viewed from the top thereof.

12. The light emitting apparatus as claimed in claim 1, wherein the carrier transport layer is a layer having a function of transporting holes.

13. Electronic equipment provided with the light emitting apparatus as defined in claim 1.

14. The light emitting apparatus as claimed in claim 1, wherein the carrier transport layer is constituted of the following carrier transport material:

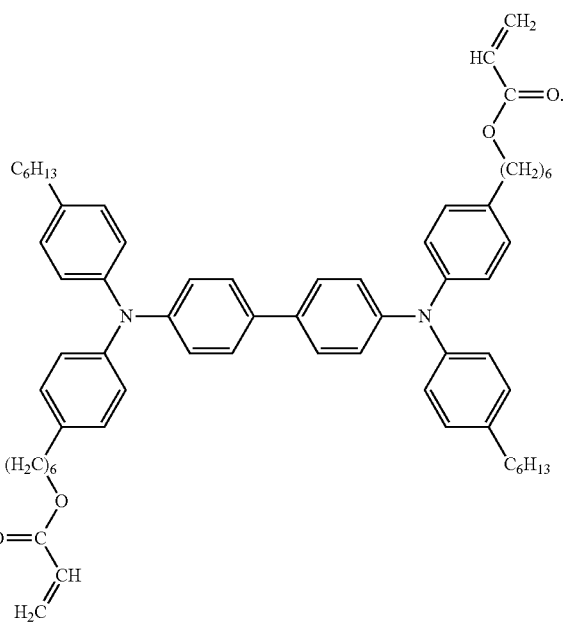

* * * * *